(12) United States Patent
Kim et al.

(10) Patent No.: US 9,607,994 B2
(45) Date of Patent: Mar. 28, 2017

(54) METHODS OF FABRICATING SEMICONDUCTOR DEVICES

(71) Applicant: Samsung Electronics Co., Ltd., Suwon-si, Gyeonggi-do (KR)

(72) Inventors: Keunnam Kim, Suwon-si (KR); Sunyoung Park, Hwaseong-si (KR); Kyehee Yeom, Suwon-si (KR); Hyeon-Woo Jang, Suwon-si (KR); Jin-Won Jeong, Seoul (KR); Changhyun Cho, Yongin-si (KR); HyeongSun Hong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/755,690

(22) Filed: Jun. 30, 2015

(65) Prior Publication Data

US 2015/0333071 A1    Nov. 19, 2015

Related U.S. Application Data

(63) Continuation of application No. 14/057,530, filed on Oct. 18, 2013, now Pat. No. 9,099,343.

(30) Foreign Application Priority Data

Oct. 18, 2012  (KR) .......................... 10-2012-0116178

(51) Int. Cl.
*H01L 27/108*    (2006.01)
*H01L 21/265*    (2006.01)
*H01L 21/768*    (2006.01)

(52) U.S. Cl.
CPC .. *H01L 27/10888* (2013.01); *H01L 21/26513* (2013.01); *H01L 21/7682* (2013.01);
(Continued)

(58) Field of Classification Search
CPC ...................... H01L 27/0207; H01L 27/10888
See application file for complete search history.

(56) References Cited

U.S. PATENT DOCUMENTS 6,503,795 B2    1/2003   Cha
7,361,550 B2    4/2008   Kim
(Continued)

FOREIGN PATENT DOCUMENTS

KR    10-2002-0046487 A    6/2002
KR    10-2003-0058252 A    7/2003
(Continued)

*Primary Examiner* — Fernando L. Toledo
*Assistant Examiner* — Neil Prasad
(74) *Attorney, Agent, or Firm* — Ward and Smith, P.A.

(57) ABSTRACT

Provided are semiconductor devices and methods of fabricating the same. In methods of forming the same, an etch stop pattern and a separate spacer can be formed on a sidewall of a bit line contact, wherein the etch stop pattern and the separate spacer each comprise material having an etch selectivity relative to an oxide. A storage node contact plug hole can be formed so that the etch stop pattern and the separate spacer form a portion of a sidewall of the storage node contact plug hole spaced apart from the bit line contact. The storage node contact plug hole can be cleaned to remove a natural oxide formed in the storage node contact plug hole. Related devices are also disclosed.

19 Claims, 41 Drawing Sheets

(52) U.S. Cl.
CPC .. *H01L 21/76897* (2013.01); *H01L 27/10855* (2013.01); *H01L 27/10885* (2013.01)

(56) References Cited

U.S. PATENT DOCUMENTS

| | | | |
|---|---|---|---|
| 8,187,952 | B2 | 5/2012 | Kim et al. |
| 8,198,189 | B2 | 6/2012 | Kim et al. |
| 8,247,324 | B2 | 8/2012 | Shin et al. |
| 8,373,214 | B2 | 2/2013 | Yoon et al. |
| 8,501,606 | B2 | 8/2013 | Lee et al. |
| 2007/0197021 | A1 | 8/2007 | Nam et al. |
| 2008/0308954 | A1* | 12/2008 | Seo ................ H01L 27/10855 257/786 |
| 2012/0012926 | A1 | 1/2012 | Ha et al. |
| 2013/0320549 | A1* | 12/2013 | Lee ................ H01L 21/76897 257/773 |

FOREIGN PATENT DOCUMENTS

| | | |
|---|---|---|
| KR | 10-2004-0079171 A | 9/2004 |
| KR | 10-2006-0114431 A | 11/2006 |
| KR | 10-2009-0001137 A | 1/2009 |

\* cited by examiner

METHODS OF FABRICATING SEMICONDUCTOR DEVICES

CROSS-REFERENCE TO RELATED APPLICATIONS

This application is a continuation of U.S. application Ser. No. 14/057,530, filed Oct. 18, 2013 in the United States Patent and Trademark Office and claims the benefit of Korean Patent Application No. 10-2012-0116178, filed on Oct. 18, 2012, in the Korean Intellectual Property Office, the disclosures of which are incorporated by reference herein in their entireties.

FIELD

The inventive concept relates to the field of electronics, in general, and more particularly, to semiconductors devices.

BACKGROUND

Higher integration of semiconductor memory devices may help to satisfy consumer demands for superior performance and inexpensive prices. In the case of semiconductor memory devices, increased integration may be desired, because integration can be important in determining price. However, expensive equipment may be needed to pattern devices at desired sizes which may set limitations in integration. Recently a variety of studies on new technology have been conducted to increase the density of semiconductor memory devices.

SUMMARY

According to example embodiments of the inventive concepts, a semiconductor device may include a substrate, a first doped region and a second doped region provided spaced apart from each other on the substrate, a storage node contact plug in contact with the first doped region, a bit line electrically connected to the second doped region, a bitline node contact plug disposed between the bit line and the second doped region, and a spacer interposed between the bit line and the storage node contact plug and between the bitline node contact plug and the storage node contact plug. The spacer may include an etch stop pattern disposed between the storage node contact plug and the bitline node contact plug to be in contact with at least the storage node contact plug, and a first sub-spacer disposed between the storage node contact plug and the bit line to be in contact with the storage node contact plug and the etch stop pattern.

In example embodiments, the etch stop pattern may be formed of the same as the first sub-spacer.

In example embodiments, the etch stop pattern fills a space between the storage node contact plug and the bitline node contact plug.

In example embodiments, the etch stop pattern has a curved op surface adjacent to the first sub-spacer.

In example embodiments, the spacer may further include an air-gap region.

In example embodiments, the air-gap region exposes a sidewall of the bit line.

In example embodiments, the spacer may further include a second sub-spacer that may be in contact with all of the bit line, the bitline node contact plug, the etch stop pattern, and the storage node contact plug.

In example embodiments, an air-gap region may be provided between the first sub-spacer and the second sub-spacer.

In example embodiments, the second sub-spacer, the first sub-spacer, and the etch stop pattern may be formed of the same material.

In example embodiments, the spacer may further include a third sub-spacer interposed between the first sub-spacer and the second sub-spacer, and the third sub-spacer may be formed of a material having an etch selectivity with respect to the first sub-spacer, the second sub-spacer and the etch stop pattern.

In example embodiments, the spacer may further include a third sub-spacer interposed between the etch stop pattern and the second sub-spacer, and the third sub-spacer may be formed of a material having an etch selectivity with respect to the first sub-spacer, the second sub-spacer and the etch stop pattern.

In example embodiments, the etch stop pattern has a sidewall in contact with the storage node contact plug that may be aligned to a sidewall of the first sub-spacer.

In example embodiments, the spacer may further include a second sub-spacer interposed between the first sub-spacer and the bit line, and a total width of the first sub-spacer and the second sub-spacer may be substantially equal to a maximum width of the etch stop pattern. Here, the second sub-spacer may be formed of a material having an etch selectivity with respect to the etch stop pattern and the first sub-spacer.

In example embodiments, the device may further include a word fine disposed between the first and second doped regions and in the substrate, and a data storing element electrically connected to the storage node contact plug.

According to example embodiments of the inventive concepts, a method of fabricating a semiconductor device may include forming a first doped region and a second doped region in a substrate, the first and second doped regions being spaced apart from each other, forming an insulating layer on the substrate to define an opening exposing the second doped region, removing a portion of the substrate exposed by the opening to form a bitline node contact hole, forming a bit line and a bitline node contact plug that may be provided on the insulating layer and in the bitline node contact hole, respectively, forming a spacer to cover sidewalls of the bit line and the bitline node contact hole, and forming a storage node contact plug to be in contact with the spacer and the first doped region. The spacer may be formed to include an etch stop pattern provided in the bitline node contact hole.

In example embodiments, the forming of the spacer may include forming the etch stop pattern to fill the bitline node contact hole, forming a first sub-spacer to cover the sidewall of the bit line, and forming a second sub-spacer to cover a sidewall of the first sub-spacer and be in contact with a top surface of the etch stop pattern.

In example embodiments, the method may further include selectively removing the first sub-spacer to form an air-gap region.

In example embodiments, the forming of the storage node contact plug may include removing at least a portion of the insulating layer adjacent to the spacer to form a storage node contact hole exposing the first doped region, and forming a storage node contact plug to fill the storage node contact hole. The storage node contact hole may be formed to expose side surfaces between the etch stop pattern and the second sub-spacer but not to expose the first sub-spacer.

In example embodiments, the method may further include removing a natural oxide layer from the storage node contact hole. Each of the second sub-spacer and the etch stop pattern may be formed of a material having an etch selectivity with respect to the natural oxide layer.

In still further embodiments, an etch stop pattern and a separate spacer can be formed on a sidewall of a bit line contact, wherein the etch stop pattern and the separate spacer each comprise material having an etch selectivity relative to an oxide. A storage node contact plug hole can be formed so that the etch stop pattern and the separate spacer form a portion of a sidewall of the storage node contact plug hole spaced apart from the bit line contact. The storage node contact plug hole can be cleaned to remove a natural oxide formed in the storage node contact plug hole.

BRIEF DESCRIPTION OF THE DRAWINGS

FIGS. 4A through 9A are plan views illustrating methods of forming the semiconductor device of FIGS. 1A and 1B.

FIGS. 4B through 9B are perspective views illustrating methods of forming the semiconductor device of FIGS. 1A and 1B.

DETAILED DESCRIPTION OF EMBODIMENTS ACCORDING TO THE INVENTIVE CONCEPT

Figure 1A:
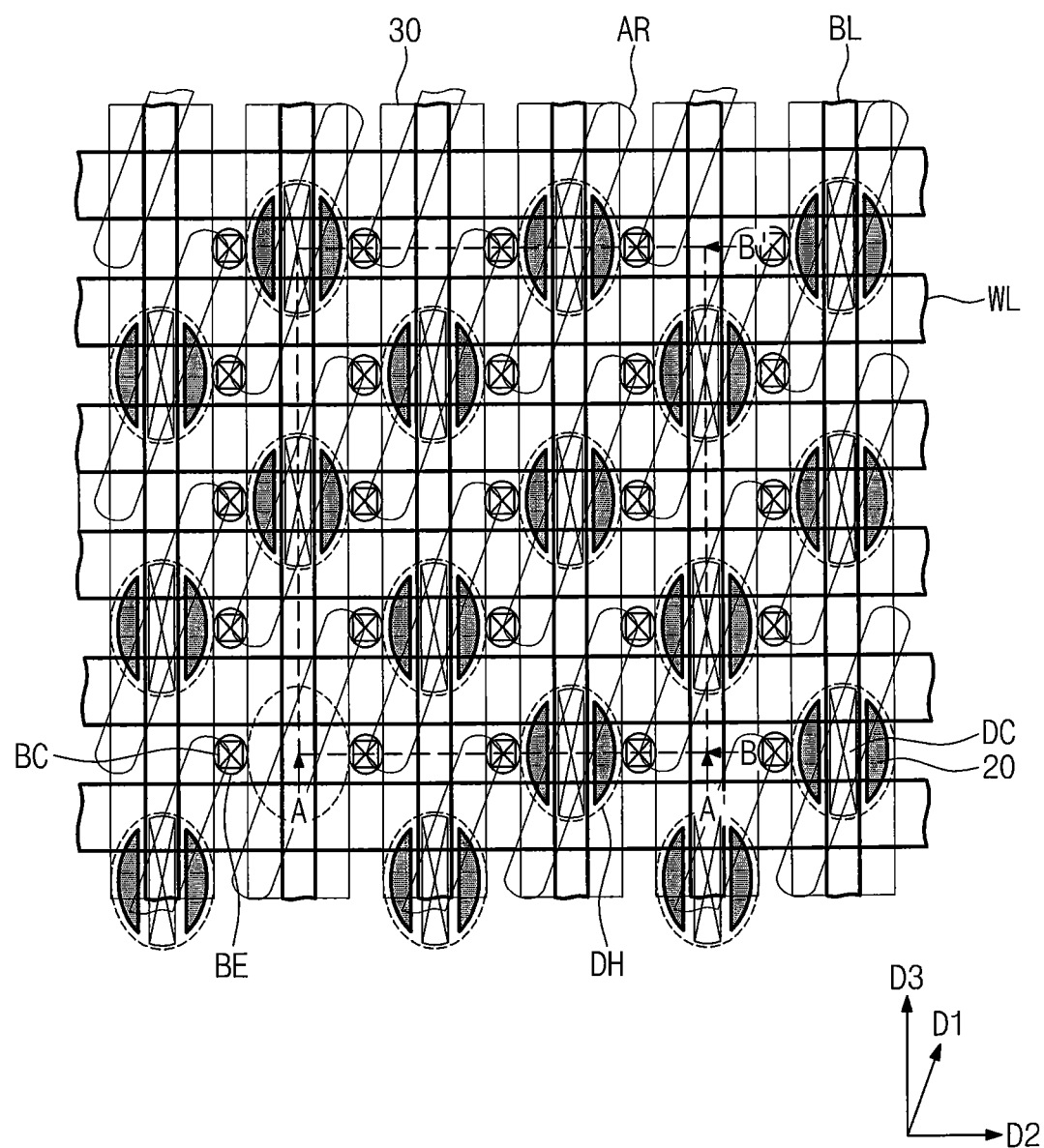
FIG. 1A is a plan view of a semiconductor device according to example embodiments of the inventive concept.

It should be noted that the figures are intended to illustrate the general characteristics of methods, structure and/or materials utilized in certain example embodiments and to supplement the written description. These drawings may, however, be to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although "air gaps" are described herein in embodiments according to the inventive concept, a gap may be defined, for example, as any void or cavity, and may be a gap filled with air (e.g., an air gap), a gap filled with an inert gas or gases (e.g., an inert gas gap), a gap defining a vacuum (e.g., a vacuum gap), etc. As appreciated by the present inventive entity, the "air-gap" may be any type of gap that promotes reduced parasitic capacitance due to coupling between immediately adjacent structures.

Figure 1B:
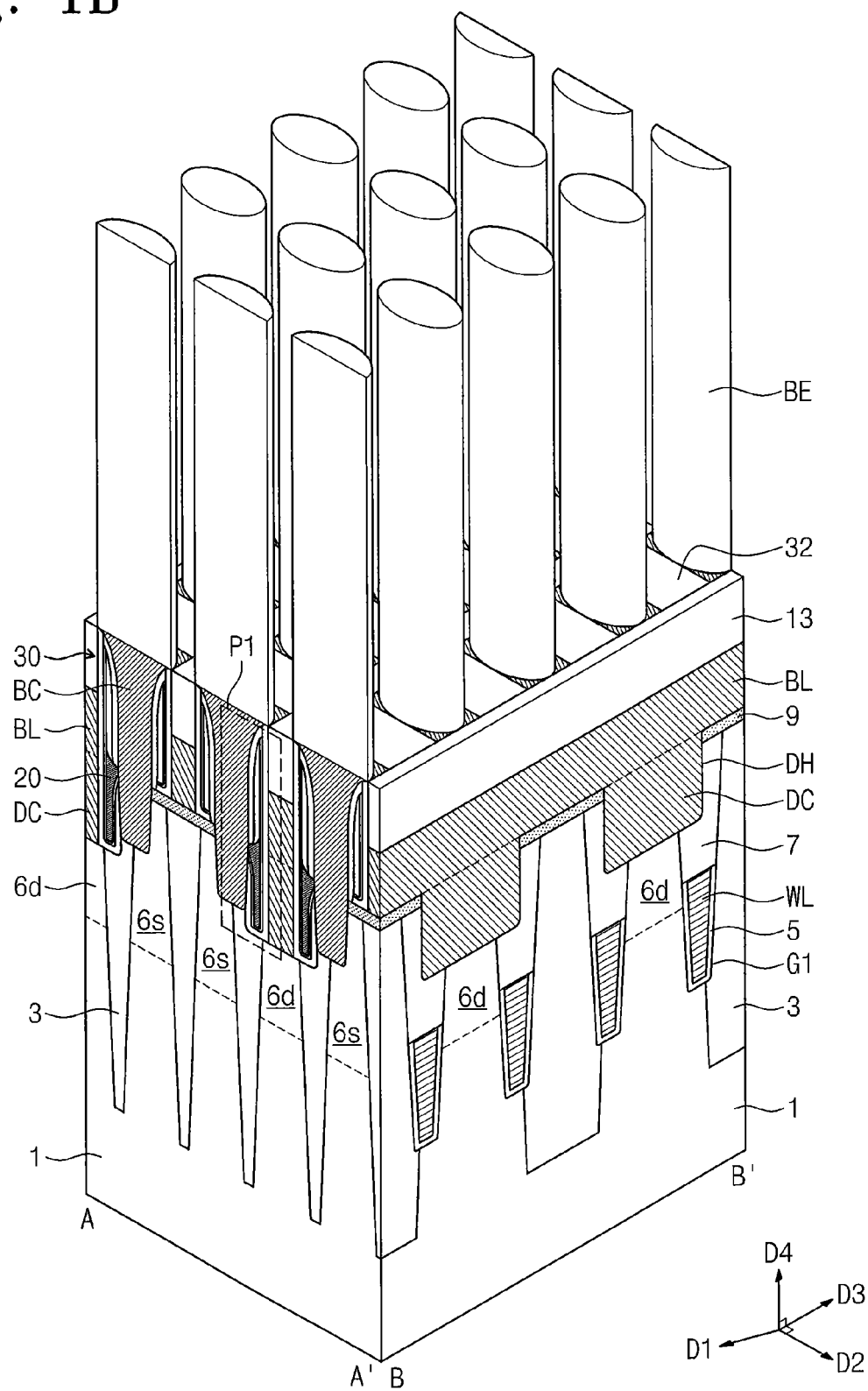
FIG. 1B is a perspective view illustrating a portion of FIG. 1A, according to example embodiments of the inventive concept.

FIG. 1A is a plan view of a semiconductor device according to example embodiments of the inventive concept, and FIG. 1B is a perspective view illustrating a portion of FIG. 1A, according to example embodiments of the inventive concept.

Referring to FIGS. 1A and 1B, a device isolation layer 3 may be provided on a substrate 1 to define active regions AR. Each of the active regions AR may be shaped like a bar elongated along a first direction D1 in plan view, and the active regions AR may be parallel to each other. Each active region AR may have a center located adjacent to an end portion of other active region AR. A plurality of word lines WL may be provided in the substrate 1 to extend along a second direction D2 and cross the active region AR and the device isolation layer 3. The word lines WL may include at least one layer selected from the group consisting of polysilicon, metal silicide, and metal. Here, the second direction D2 may be a direction crossing the first direction D1. Top surfaces of the word lines WL may be lower than top surfaces of the substrate 1. A gate insulating layer 5 may be interposed between the word lines WL and the substrate 1. A first doped region 6s may be provided in a portion of the substrate 1 positioned at one side of the word line WL, while a second doped region 6d may be provided in other portion of the substrate 1 positioned at other side of the word line WL. A first capping pattern 7 may be provided on the word lines WL. The first capping pattern 7 may be formed of, for example, a silicon nitride layer and/or a silicon oxynitride layer.

According to example embodiments of the inventive concept, since the word lines WL are provided in the substrate 1, a cell transistor may have a recessed channel region, which may address short channel effects and leakage current, in a highly-integrated semiconductor device.

Figure 2:
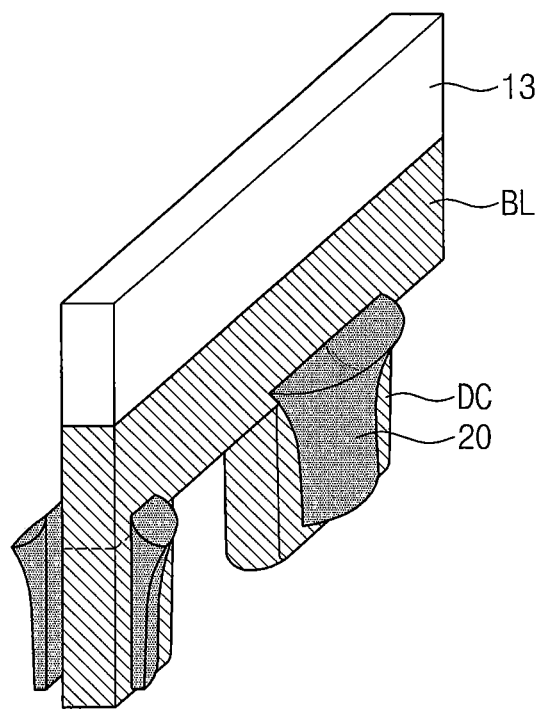
FIG. 2 is a perspective view illustrating a bit line and an etch stop pattern.
Figure 3A:
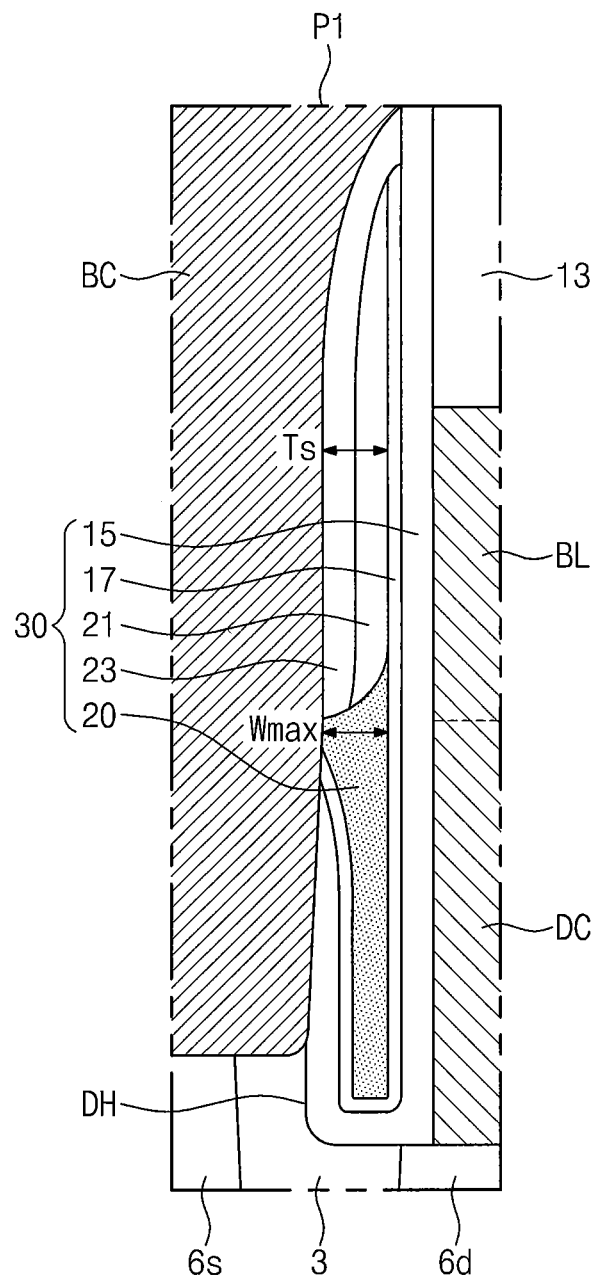
FIGS. 3A and 3B are enlarged sectional views exemplarily illustrating a portion 'P1' of FIG. 1B.
Figure 3B:
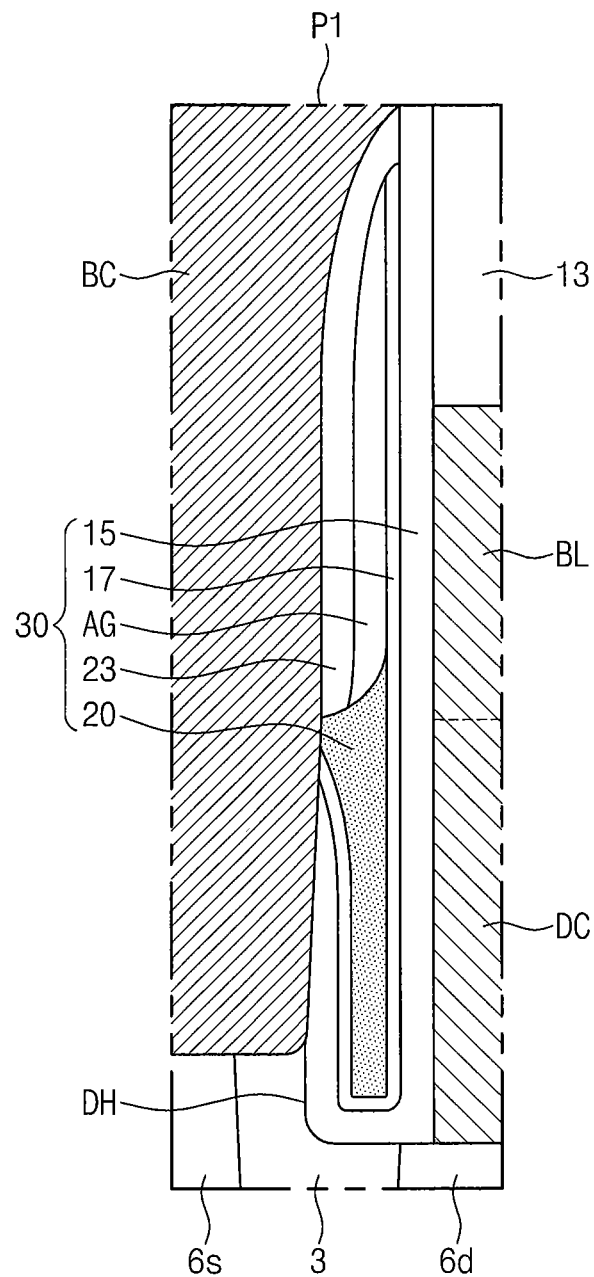

FIG. 2 is a perspective view illustrating a bit line and an etch stop pattern, and FIGS. 3A and 3B are enlarged cross-sectional views exemplarily illustrating a portion 'P1' of FIG. 1B.

Referring to FIGS. 1A, 1B, 2 and 3A, a first insulating layer 9 may be provided on the substrate 1. The first insulating layer 9 may be formed of at least one of a silicon oxide layer, a silicon nitride layer, or a silicon oxynitride layer. A bit line BL may be provided on the first insulating layer 9 to extend along a third direction D3 crossing both of the first and second directions D1 and D2. The bit line BL may be a metal-containing layer. A second capping pattern 13 may be provided on the bit line BL. The second capping pattern 13 may be formed of the same material as the first capping pattern 7.

The bit line BL may be electrically connected to the second doped region 6d by a bit line node contact plug DC, which may be formed to penetrate the first insulating layer 9. The bitline node contact plug DC may include at least one layer selected from the group consisting of metal silicide, polysilicon, metal nitride, and metal. The bit line BL may have the same width as the bitline node contact plug DC. A sidewall of the bit line BL may be aligned to that of the bitline node contact plug DC. The bitline node contact plug DC may be provided in a bit line node contact hole MI. A bottom surface of the bitline node contact hole DH (or the bitline node contact plug DC) may be lower than the top surface of the substrate 1. A width of the bitline node contact hole DH may be greater than that of the bitline node contact plug DC, when the widths are measured along the second direction D2. Storage node contact plugs BC may be provided between the bit lines BL and connected to the first doped regions 6s, respectively. The storage node contact plug BC may include at least one layer selected from the group consisting of metal silicide, polysilicon, metal nitride, and metal. A bottom surface of the storage node contact plug BC may be lower than the top surface of the substrate 1.

Referring to FIGS. 1A, 1B, 2 and 3A, a spacer 30 may be provided between the bit line BL and the storage node contact plug BC and between the bitline node contact plug DC and the storage node contact plug BC. The spacer 30 may include an etch stop pattern 20 provided in the bitline node contact hole DH. As shown in FIG. 1A, the etch stop pattern 20 may be shaped like an elongated half circle, in plan view. The etch stop pattern 20 may have a curved top surface. The spacer 30 may further include a first sub-spacer 23, which may be provided in contact with the storage node contact plug BC and the top surface of the etch stop pattern 20, and a second sub-spacer 21 interposed between the first sub-spacer 23 and the bit line BL. In some example embodiments, the spacer 30 may further include a third sub-spacer 17 and a fourth sub-spacer 15 interposed between the second sub-spacer 21 and the bit line BL. In some example embodiments, the first sub-spacer 23, the etch stop pattern 20, and the fourth sub-spacer 15 may be formed of a material (e.g., a silicon nitride layer) having an etch selectivity with respect to a natural oxide layer. The second and third sub-spacers 21 and 17 may be formed of a material (e.g., a silicon oxide layer) having an etch selectivity with respect to the etch stop pattern 20. In some example embodiments, a total thickness Ts of the first and second sub-spacers 23 and 21 may be substantially equal to a maximum width, Wmax, of the etch stop pattern 20. The first sub-spacer 23 may have a sidewall aligned to a sidewall of the etch stop pattern 20. The second sub-spacer 21 may have a sidewall aligned to other sidewall of the etch stop pattern 20. The third sub-spacer 17 may be in contact with both sidewalls and a bottom surface of the etch stop pattern 20 and be in contact with the storage node contact plug BC. The fourth sub-spacer 15 may extend to be in contact with a sidewall of the bitline node contact plug DC, both sidewalls and a bottom surface of the third sub-spacer 17, and the storage node contact plug BC.

Referring to FIG. 3B, the second sub-spacer 21 of FIG. 3A may be removed. For example, an air-gap region AG may be provided between the first sub-spacer 23 and the third sub-spacer 17. The top surface of the etch stop pattern 20 may be partially exposed by the air-gap region AG. Since the air-gap region AG is provided within the spacer 30, it may improve electrical characteristics (such as electrical isolation, electrical interference, or leakage current) between the storage node contact plug BC and the hit line BL.

A second insulating layer 32 may be provided between the bit lines BL and between the storage node contact plugs BC. A data storing element may be provided on the storage node contact plug BC. In example embodiments, the data storing element may be a capacitor including a lower electrode BE, a dielectric, and an upper electrode, such that the semiconductor device may be used as a dynamic random access memory (DRAM) device. The device may further include supporting patterns, which may be configured to support mechanically at least a portion of the sidewall of the lower electrode BE. The lower electrode BE may be formed to have a plug- or pillar-shaped structure.

FIGS. 4A through 9A are plan views illustrating methods of forming the semiconductor device of FIGS. 1A and 1B, and FIGS. 4B through 9B are perspective views illustrating methods of forming the semiconductor device of FIGS. 1A and 1B. FIG. 10A through FIG. 10L are cross-sectional views illustrating methods of forming the semiconductor device having a sectional view taken along a section B-B' of FIG. 1B.

Figure 4A:
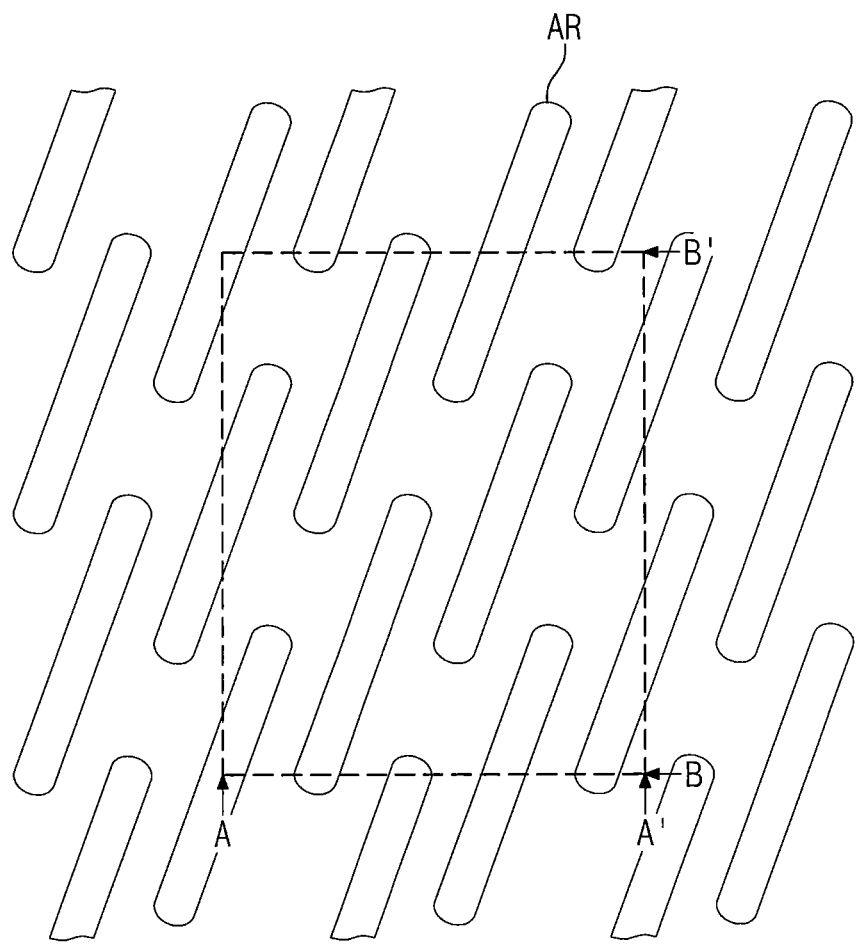
Figure 4B:
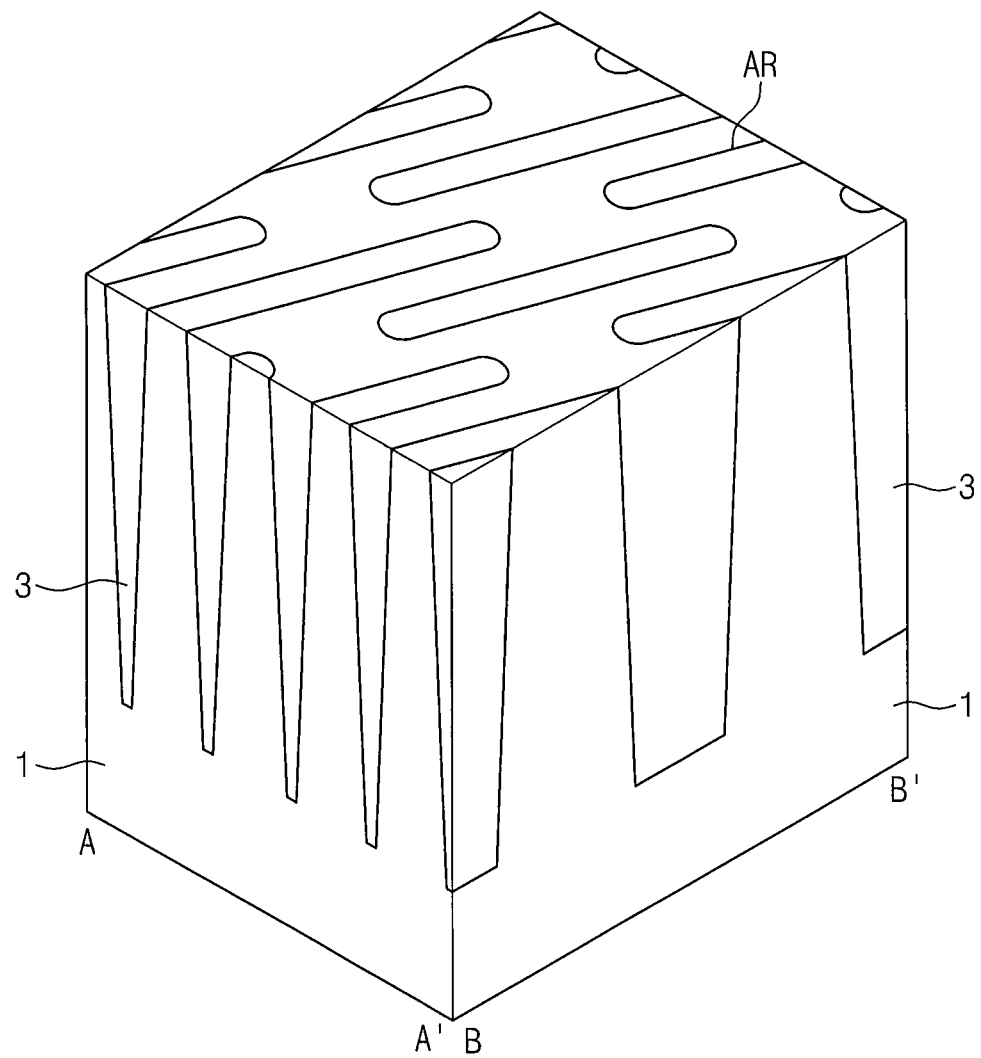

Referring to FIGS. 4A and 4B, a device isolation layer 3 may be formed in a substrate 1 to define active regions AR. The substrate 1 may be, for example, a silicon wafer or a silicon-on-insulator (SOI) wafer. The device isolation layer 3 may be formed using a shallow trench isolation (STI) technology. The device isolation layer 3 may be formed of, for example, at least one of a silicon oxide layer, a silicon nitride layer, or a silicon oxynitride layer.

Figure 5A:
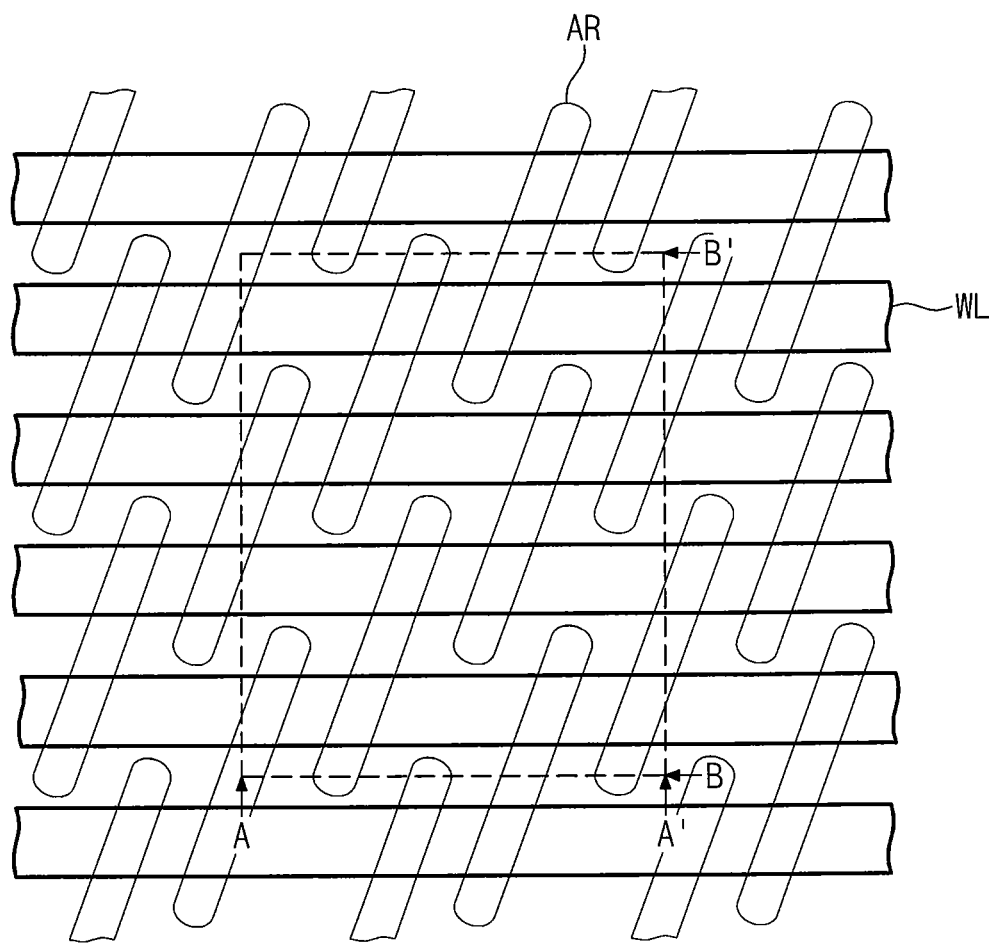
Figure 5B:
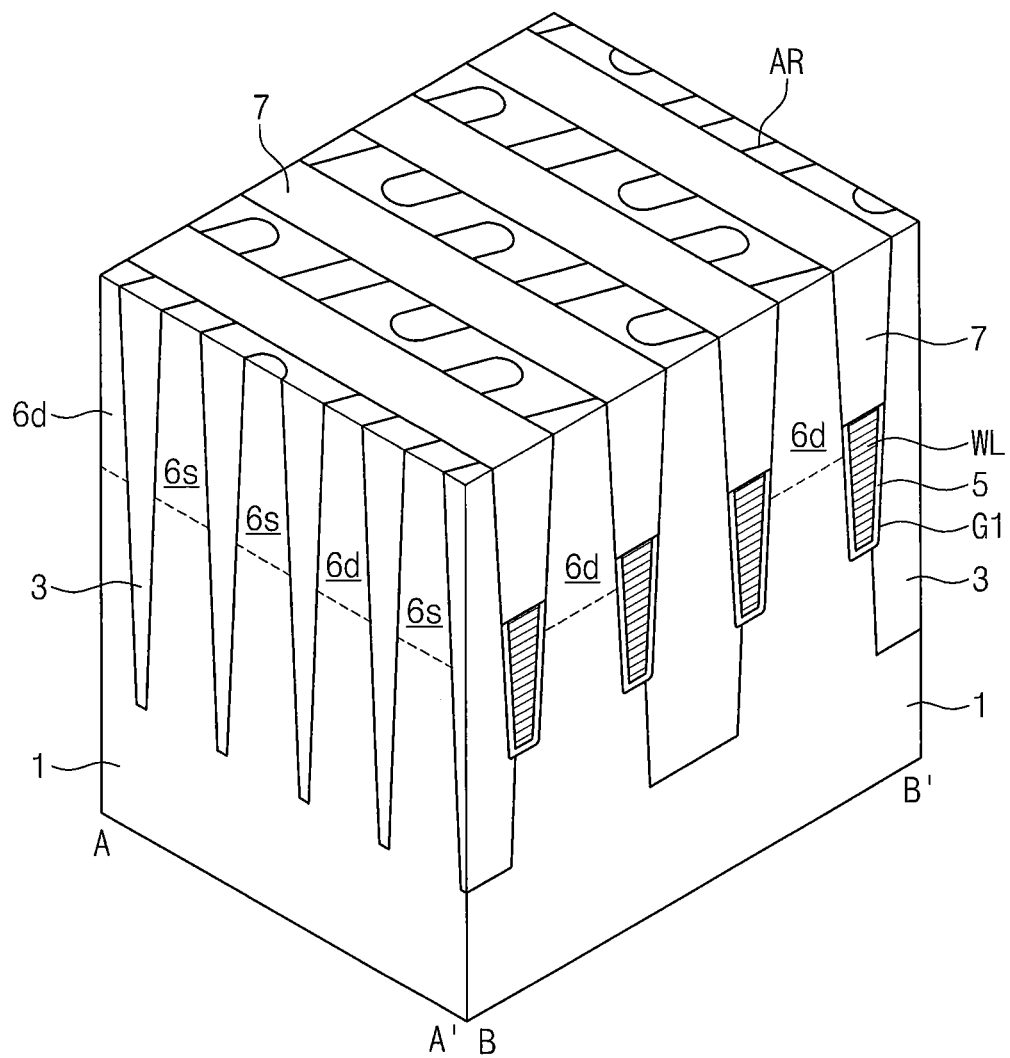

Referring to FIGS. 5A and 5B, a plurality of line-shaped first mask patterns may be formed on the substrate 1 parallel to a second direction D2, and then, the device isolation layer 3 and the active region AR may be etched using the first mask patterns to form a plurality of first grooves G1. By controlling the etching recipe, the device isolation layer 3 may be etched at a higher etch rate, compared with the substrate 1. As a result, the first groove G1 may be formed to have a curved bottom surface. A gate insulating layer 5 may be formed in the grooves G1. The gate insulating layer 5 may be formed of, for example, a thermally-grown oxide layer. A conductive layer may be deposited in the first groove G1 having the gate insulating layer 5 therein to form word lines WL. First capping patterns 7 may be formed on the word lines WL in the first grooves G1, respectively. The first capping patterns 7 may be formed of, for example, a silicon nitride layer and/or a silicon oxynitride layer. The first mask pattern may be removed, and an ion implantation process may be performed to form first doped regions 6s and second doped regions 6d in the active regions AR of the substrate 1 that are not covered with the first capping pattern 7. The first doped regions 6s and the second doped regions 6d may be formed to have the same conductivity type (e.g., n-type) as each other. In some example embodiments, the first doped regions 6s may be formed to have a depth different from those of the second doped regions 6d, and to do this, a plurality of ion implantation processes may be performed.

Figure 6A:
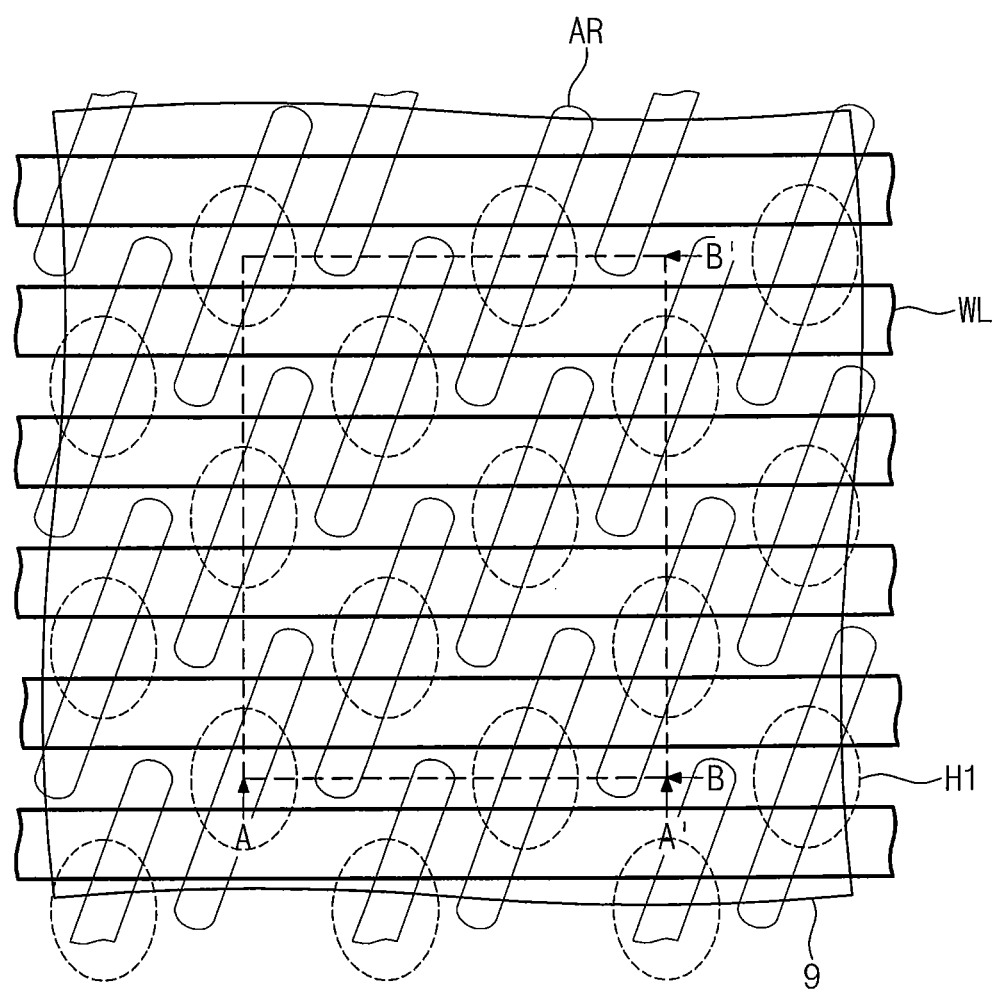
Figure 6B:
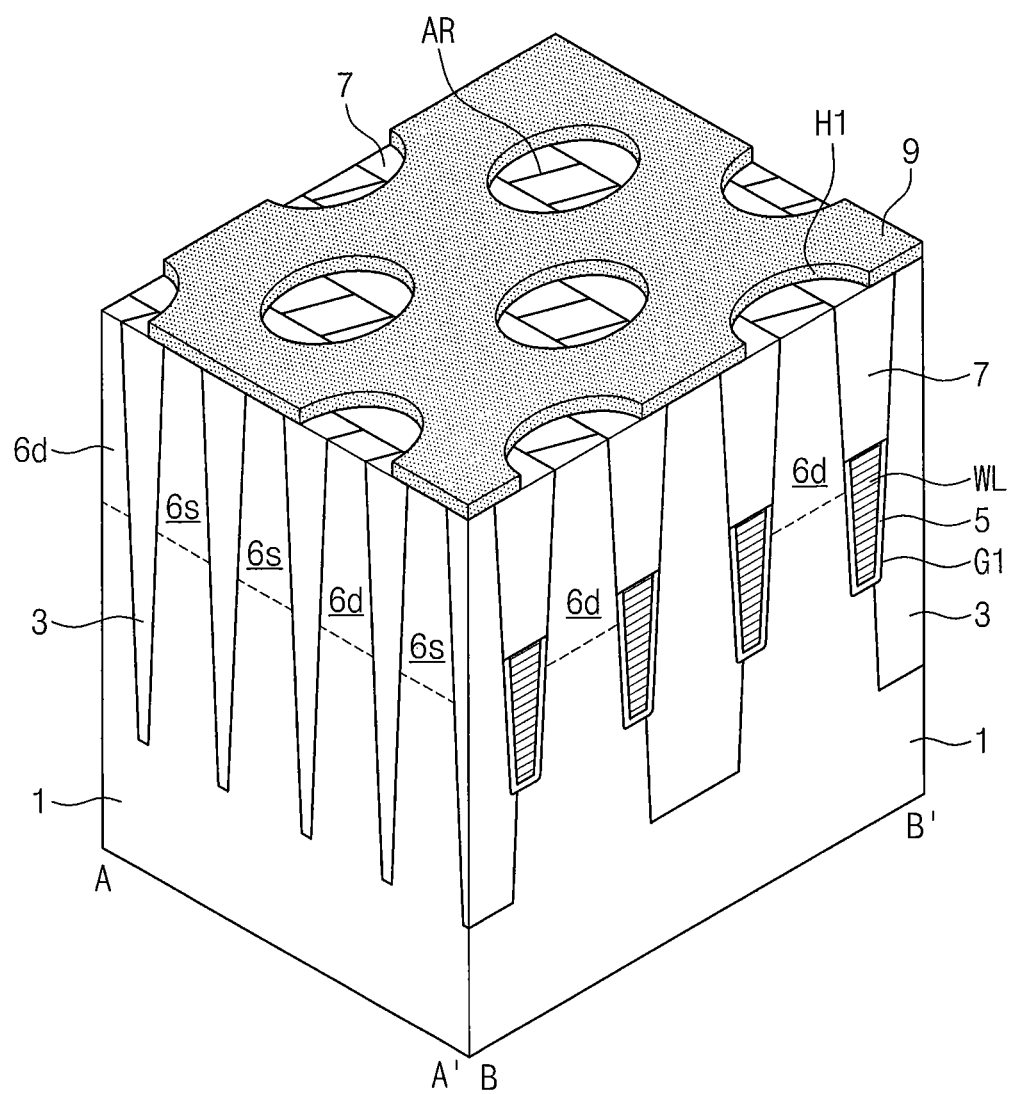

Referring to FIGS. 6A and 6B, a first insulating layer 9 may be formed to cover the top surface of the substrate 1. The first insulating layer 9 may be formed of at least one of a silicon oxide layer, a silicon nitride layer, or a silicon oxynitride layer. A second mask pattern may be formed on the first insulating layer 9, and then, the first insulating layer 9 may be patterned using the second mask pattern as an etch mask to form openings H1 exposing the second doped regions 6d. The openings H1 may be formed to be wider than the second doped region 6d, and thus, the device isolation layer 3 and the first capping pattern 7 may be partially exposed through the openings H1.

Figure 7A:
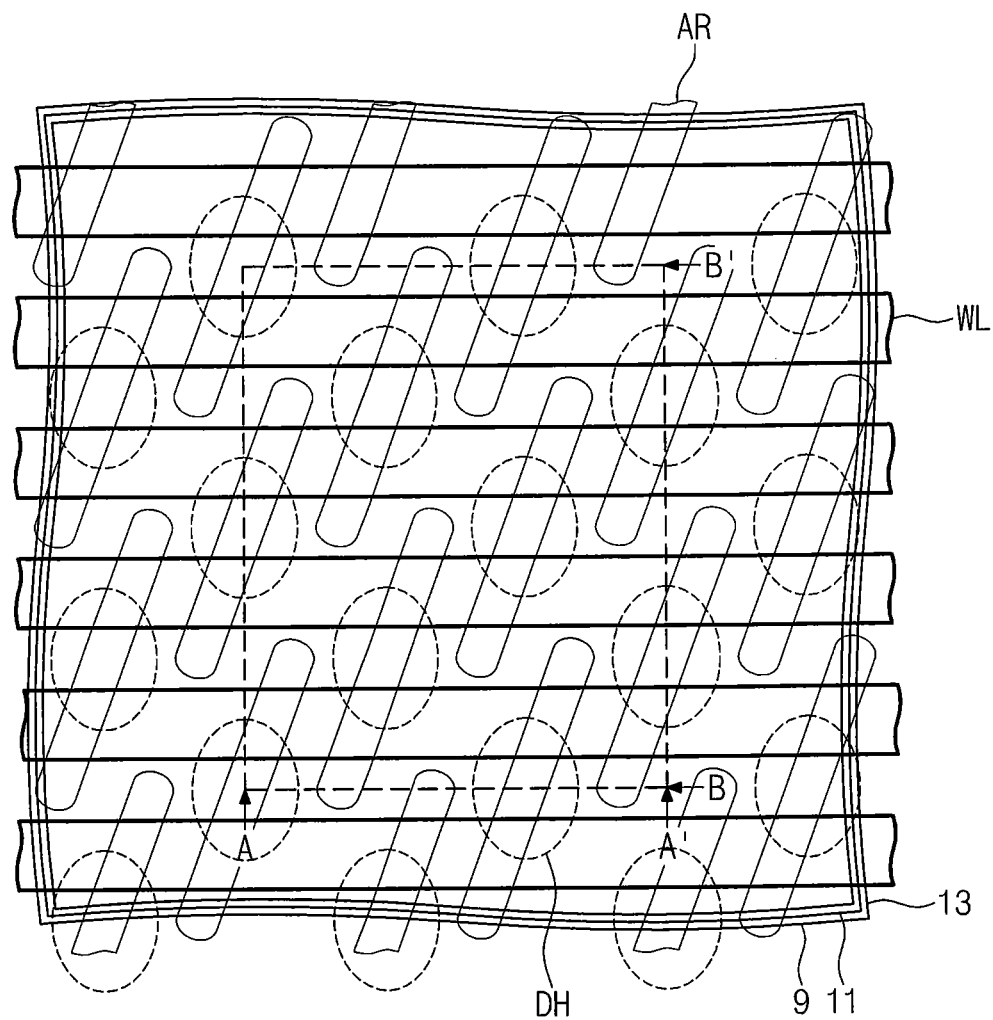
Figure 7B:
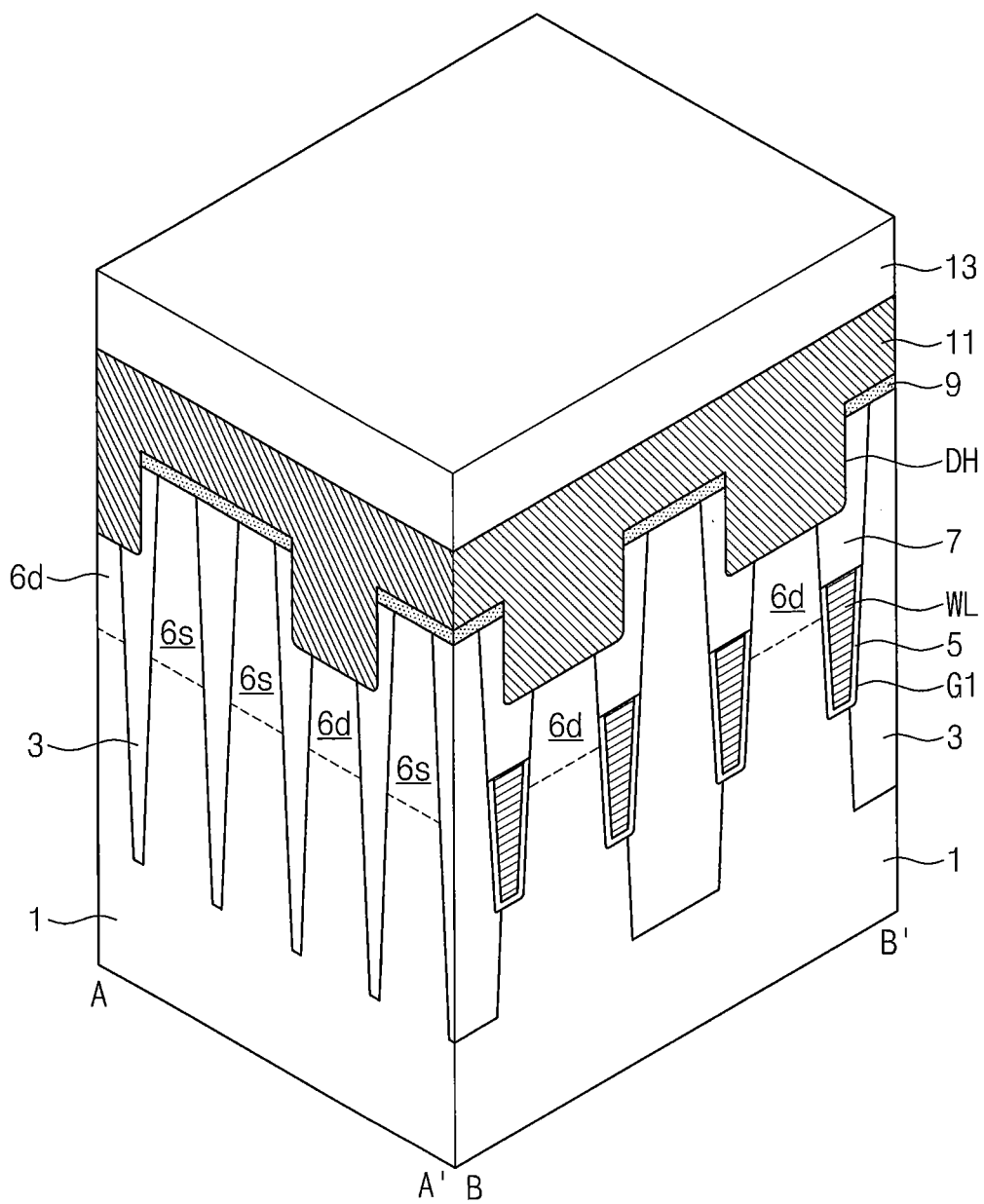
Figure 10A:
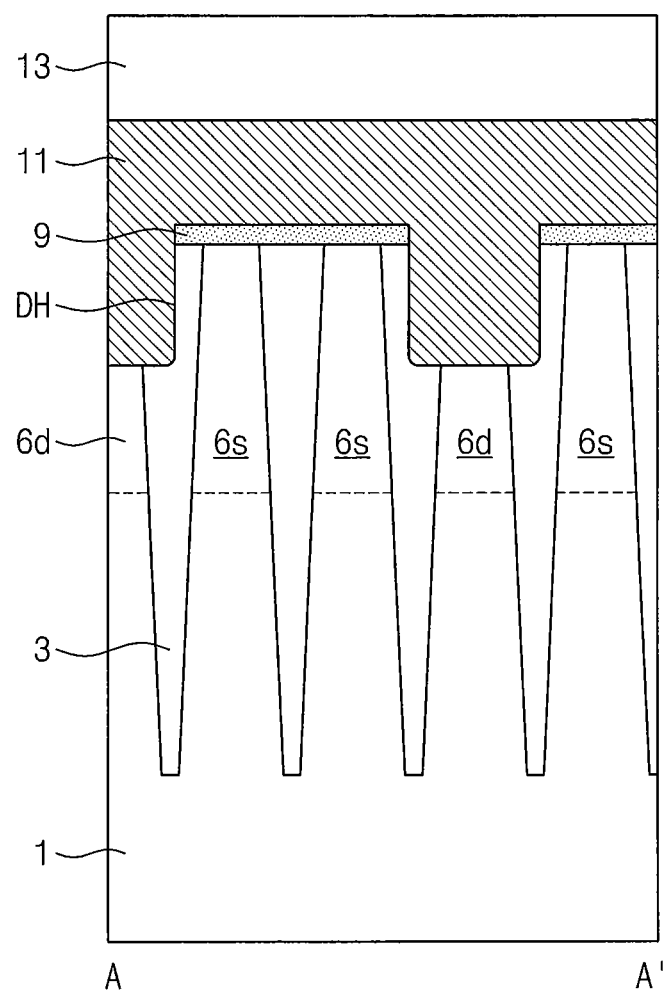
FIG. 10A through FIG. 10L are cross-sectional views illustrating methods of forming the semiconductor device having a cross-sectional view taken along a section B-B' of FIG. 1B.
Figure 10B:
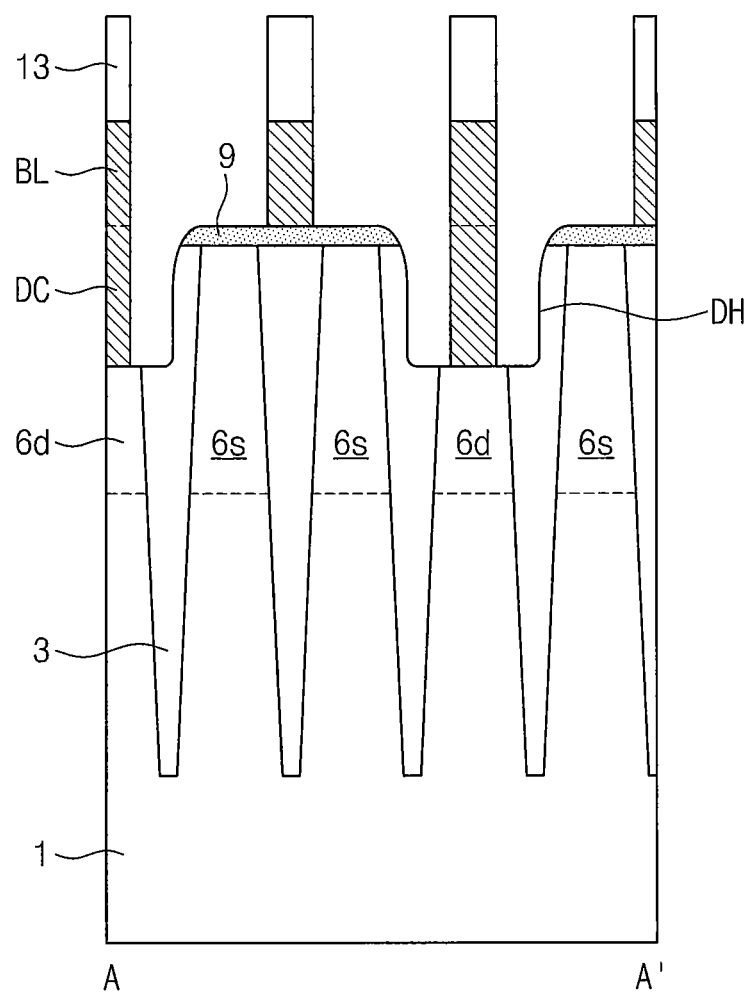

Referring to FIGS. 7A, 7B and 10B, by using the second mask pattern as an etch mask, portions of the substrate 1, the device isolation layer 3, and the first capping pattern 7 exposed by the openings H1 may be etched to form bitline node contact holes DH. The bitline node contact holes DH may be formed to have bottom surfaces that are located at a level higher than bottom surfaces of the second doped regions 6d and the first capping patterns 7. After the formation of the bitline node contact holes DH, the second mask pattern may be removed. A conductive layer 11 and a second capping layer 13 may be sequentially stacked on the first insulating layer 9. The conductive layer 11 may be formed to fill the bitline node contact holes DH.

Figure 8A:
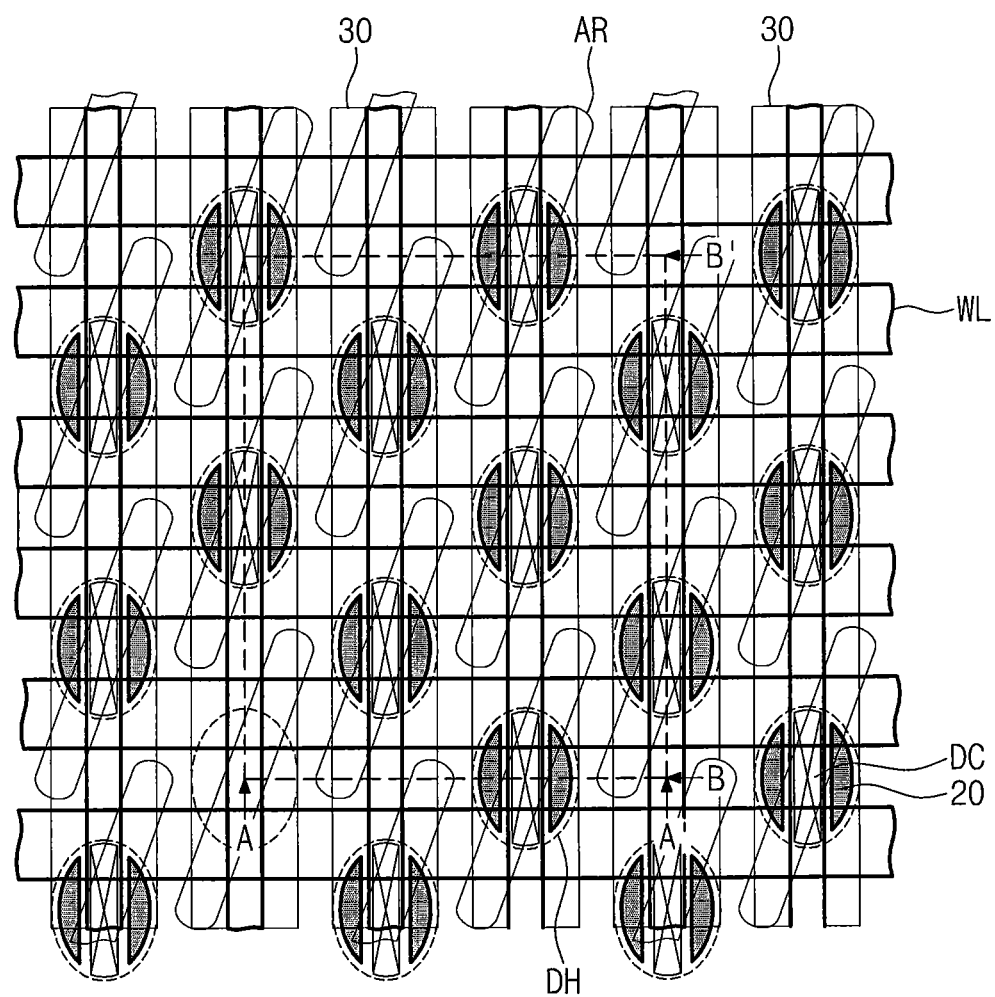
Figure 8B:
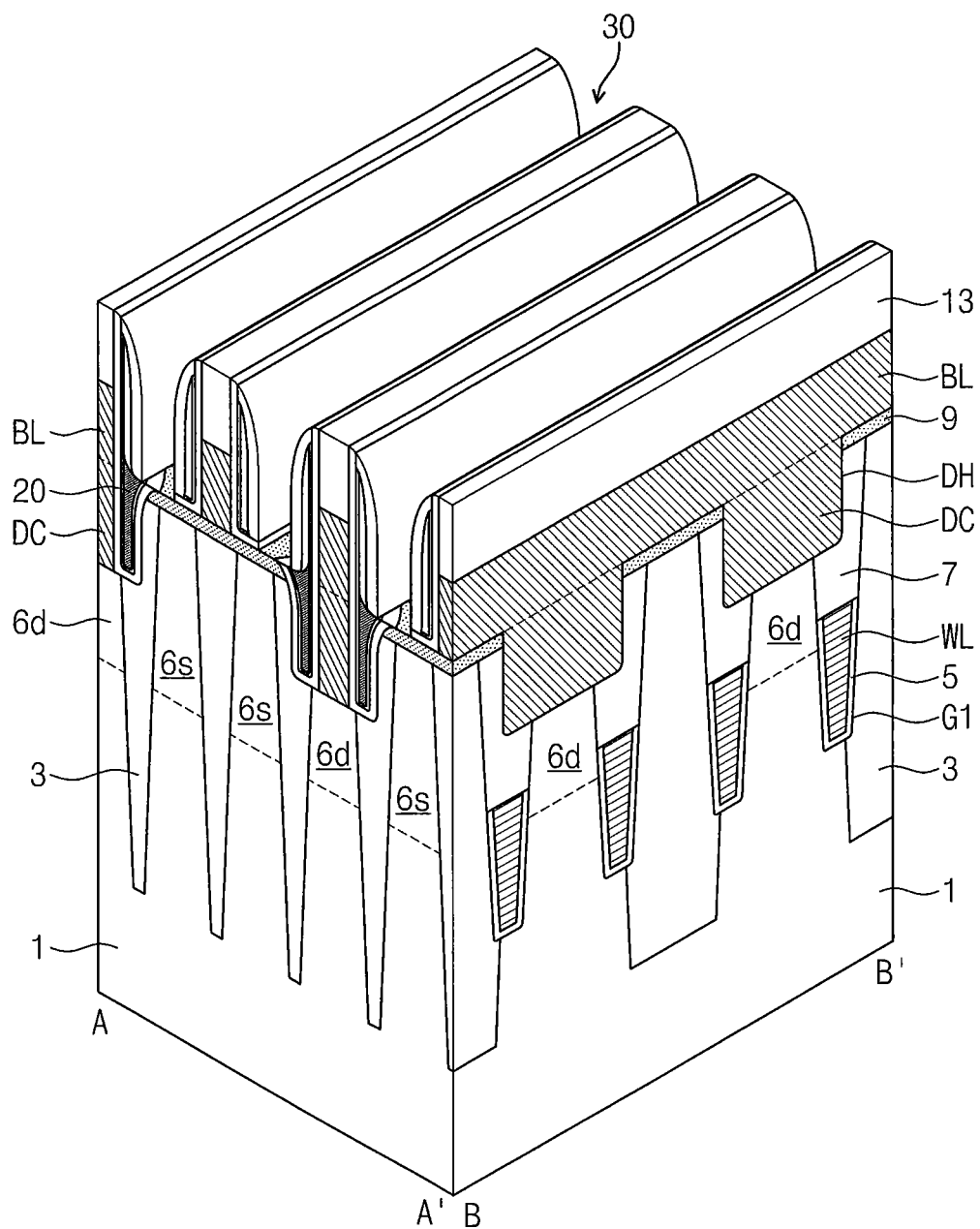

Referring to FIGS. 8A and 8B, the second capping layer 13 and the conductive layer 11 may be sequentially patterned to form a plurality of line shaped second capping patterns 13, bit lines St, provided below the second capping patterns 13, and bitline node contact plugs DC provided in the bitline node contact holes DH. Thereafter, spacers 30 may be formed to cover sidewalls of the second capping patterns 13, the bit lines BL, and the bitline node contact plugs DC. The spacers 30 may be formed to have features described, for example, with reference to FIGS. 3A and 3B. Hereinafter, the formation of the spacers 30 will be described in still greater detail with reference to FIGS. 10A through 10J.

Referring to FIGS. 10A and 10B, the second capping layer 13 and the conductive layer 11 may be sequentially patterned to form the line-shaped second capping patterns 13, the bit lines BL provided below the second capping patterns 13, and the bitline node contact plugs DC provided in the bitline node contact holes DH. Here, the first insulating layer 9 and the device isolation layer 3 may be partially etched around openings of the bitline node contact holes DH, and thus, the openings of the bitline node contact holes DH may be rounded and enlarged.

Figure 10C:
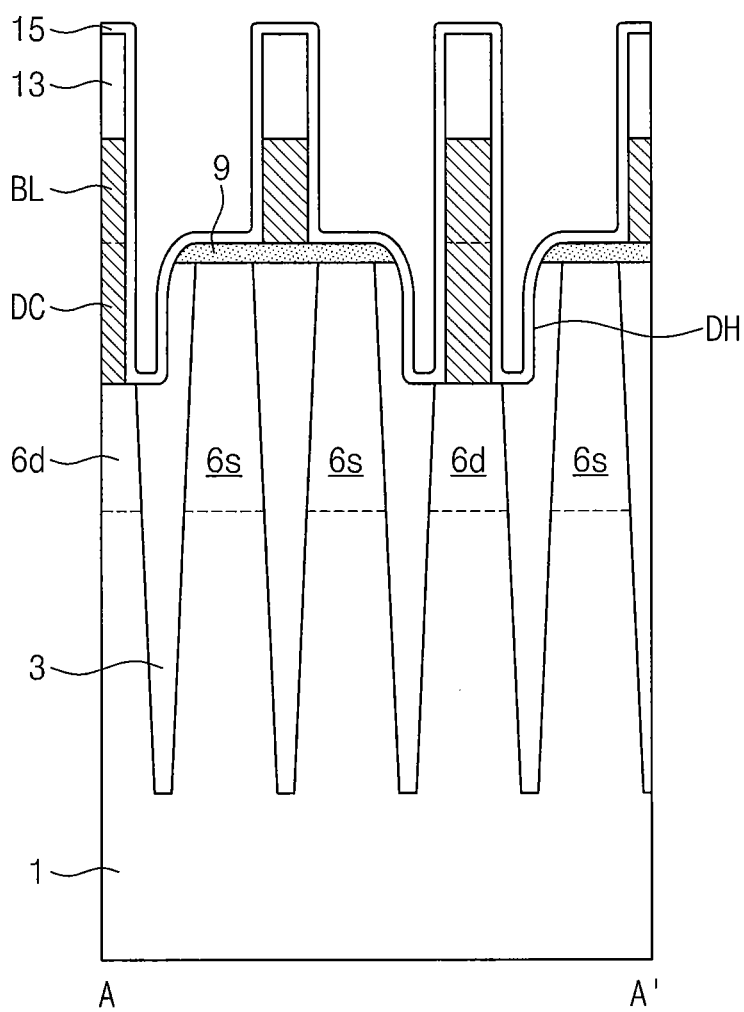

Referring to FIG. 10C, a fourth sub-spacer layer 15 may be conformally formed on the substrate 1. The fourth sub-spacer layer 15 may be formed of, for example, a silicon nitride layer.

Figure 10D:
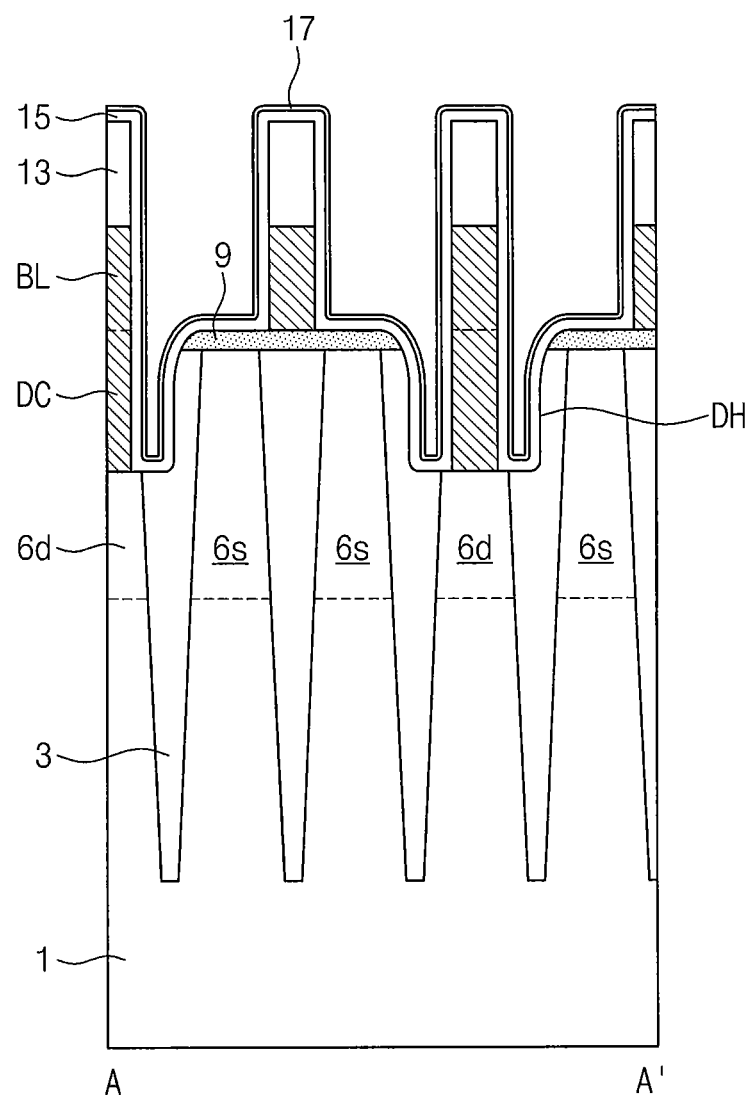

Referring to FIG. 10D, a third sub-spacer layer 17 may be conformally formed on the fourth sub-spacer layer 15. The third sub-spacer layer 17 may be formed of a material (e.g., a silicon oxide layer) having an etch selectivity with respect to the fourth sub-spacer layer 15. The third sub-spacer layer 17 may be formed to a thickness that is much less than that of each of the fourth sub-spacer layer 15 and second and first sub-spacer layers 21 and 23 to be formed in subsequent processes. In some example embodiments, the fourth sub-spacer layer 15 and the third sub-spacer layer 17 may be formed to cover bottom and side surfaces of the bitline node contact hole DH which are not covered and exposed by the bit line node contact DC.

Figure 10E:
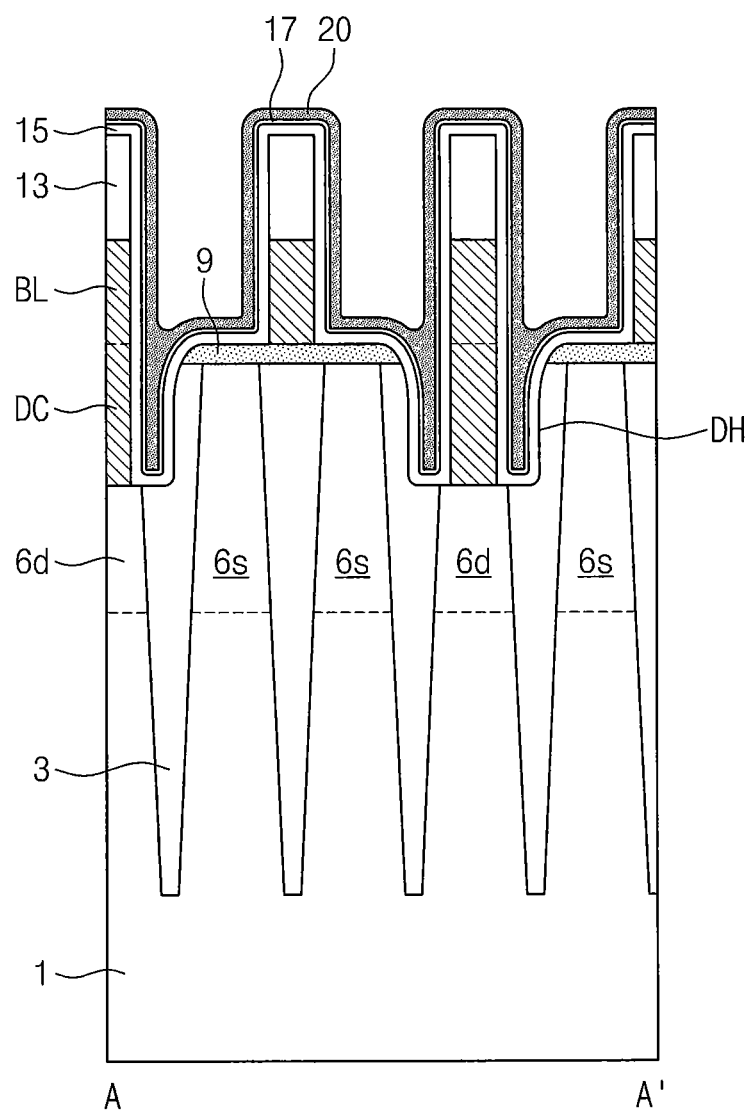

Referring to FIG. 10E, an etch stop layer 20 may be conformally formed on the third sub-spacer layer 17. The etch stop layer 20 may be formed thick enough to fill unoccupied portions of the bitline node contact holes DH. In some example embodiments, the etch stop layer 20 may be formed of a material having an etch selectivity with respect to the third sub-spacer layer 17 and to a natural oxide layer. For example, the etch stop layer 20 may be formed of a silicon nitride layer.

Figure 10F:
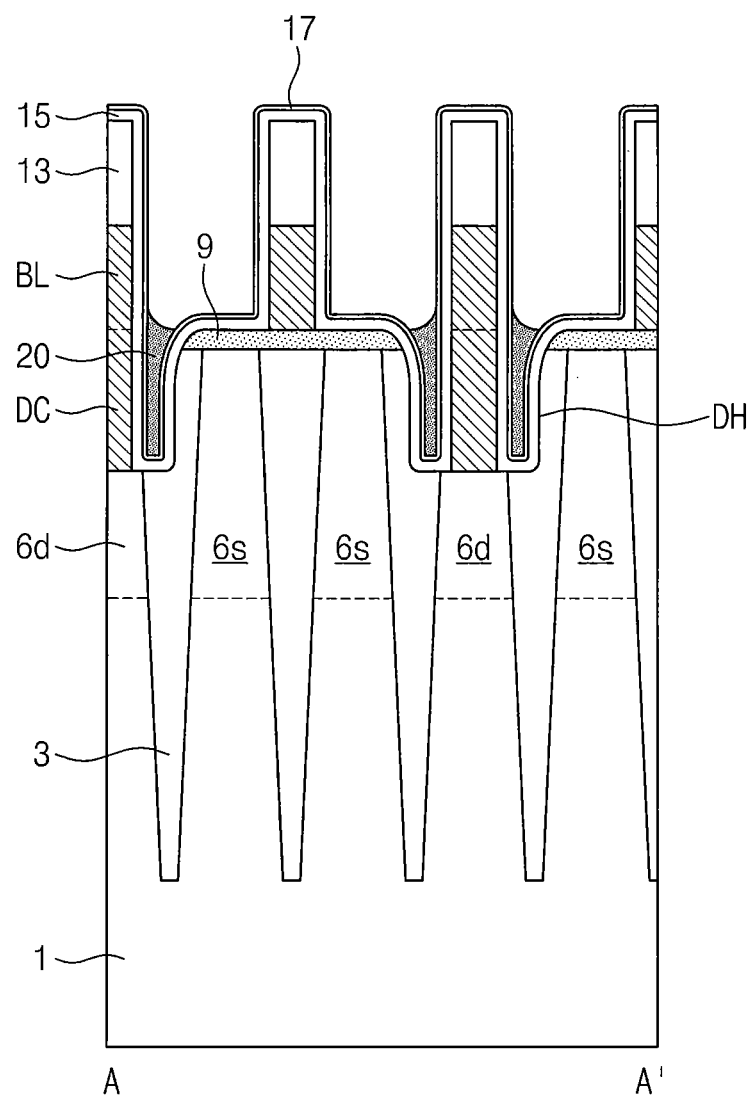

Referring to FIG. 10F, the etch stop layer 20 may be isotropically etched to form etch stop patterns 20 localized to the bitline node contact holes DH. The isotropic etching of the etch stop layer 20 may be performed using, for example, phosphoric acid. In some example embodiments, the third sub-spacer layer 17 may serve as an etch stop layer in the isotropic etching process. As the result of the isotropic etching process, the etch stop patterns 20 may be formed to have a curved top surface.

Figure 10G:
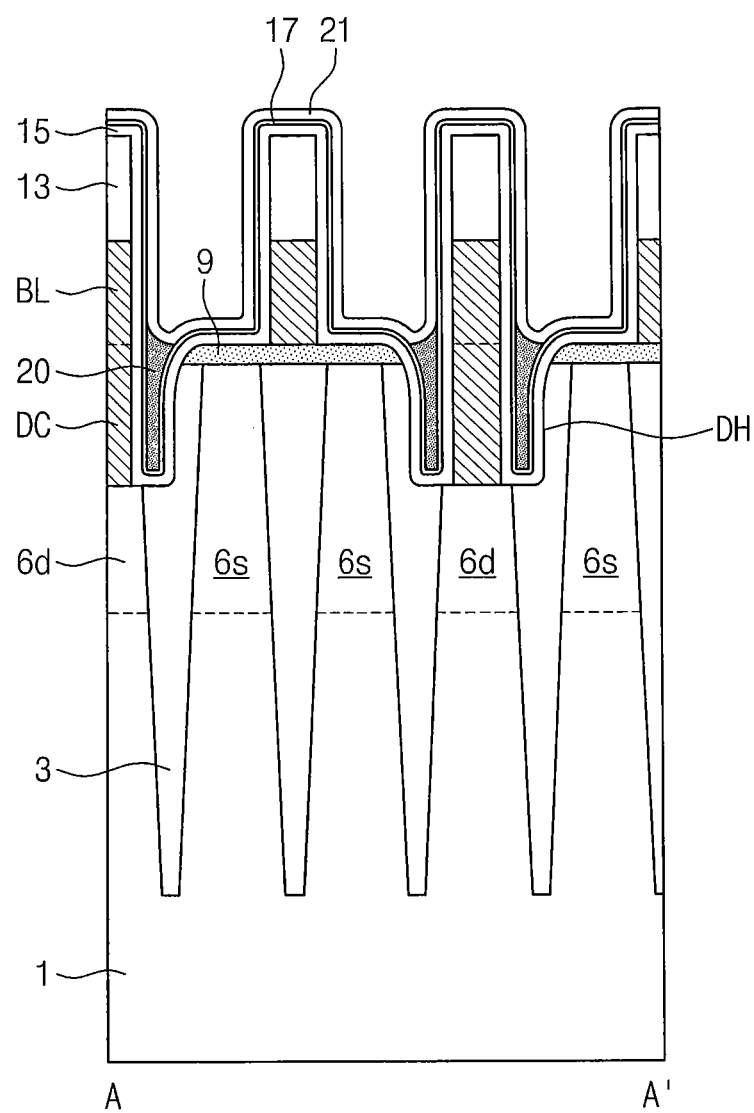

Referring to FIG. 10G, a second sub-spacer layer 21 may be conformally formed on the third sub-spacer layer 17. In some example embodiments, the second sub-spacer layer 21 may be formed of a material having an etch selectivity with respect to the etch stop patterns 20. For example, the second sub-spacer layer 21 may be formed of a silicon oxide layer.

Figure 10H:
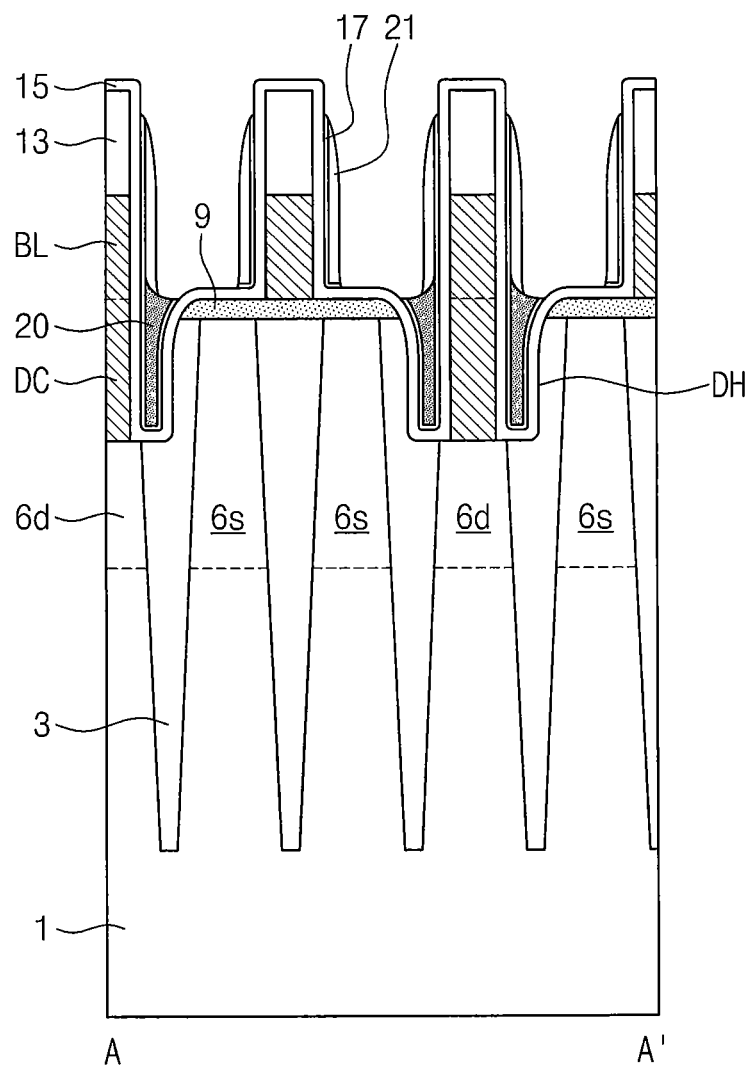

Referring to FIG. 10H, the second sub-spacer layer 21 and the third sub-spacer layer 17 may be anisotropically etched to form third sub-spacers 17 and second sub-spacers 21 on sidewalls of the fourth sub-spacer layer 15. In some example embodiments, upper portions of the fourth sub-spacer layer 15 may be exposed by the third sub-spacers 17 and the second sub-spacers 21. Furthermore, a top surface of each of the etch stop patterns 20 may be partially exposed by the third sub-spacers 17 and the second sub-spacers 21.

Figure 10I:
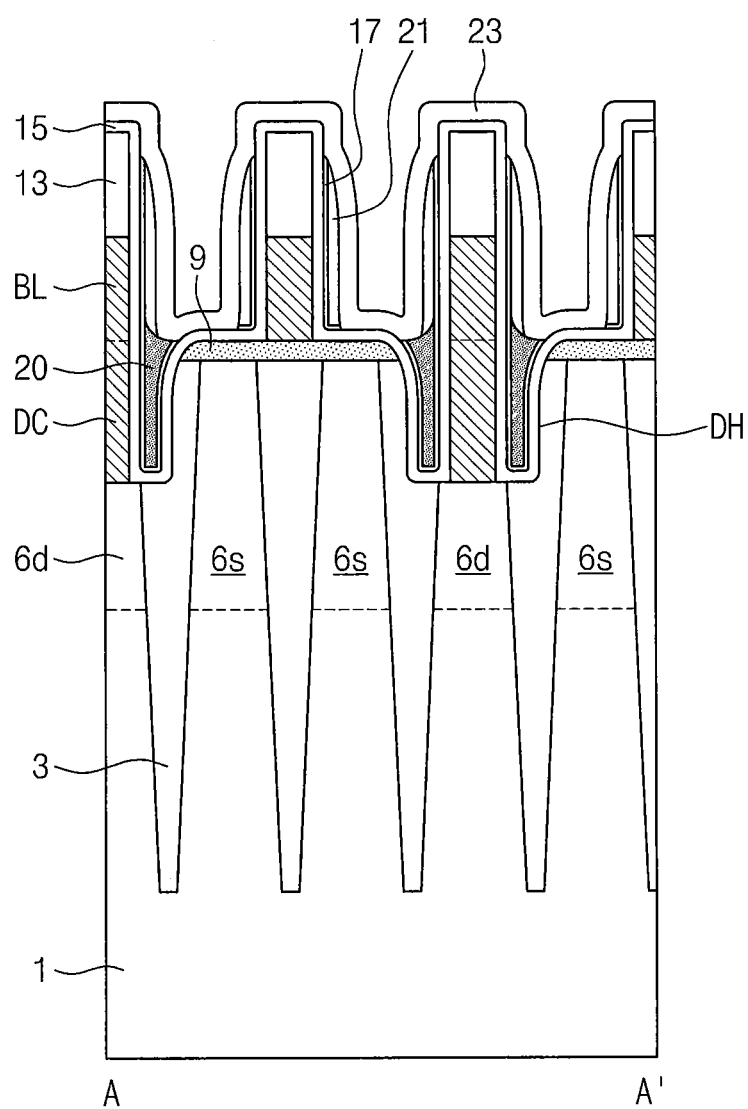

Referring to FIG. 10I, a first sub-spacer layer 23 may be conformally formed on the substrate 1. In some example embodiments, the first sub-spacer layer 23 may be formed of a material having an etch selectivity with respect to a natural oxide layer. For example, the first sub-spacer layer 23 may be formed of a silicon nitride layer.

Figure 10J:
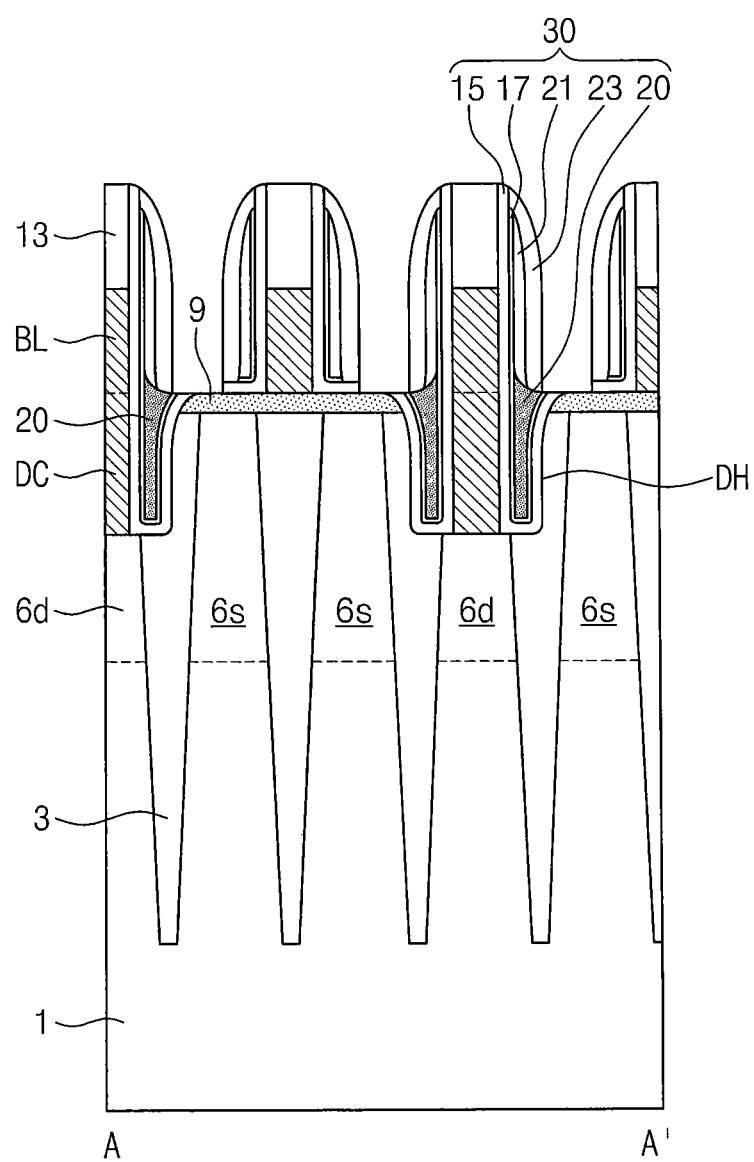

Referring to FIG. 10J, the first sub-spacer layer 23 and the fourth sub-spacer layer 15 may be anisotropically etched to form first sub-spacers 23 and fourth sub-spacers 15. As the result of the formation of first sub-spacers 23 and fourth sub-spacers 15, the spacers 30, each of which includes the first to fourth sub-spacers 23, 21, 17, and 15 and the etch stop pattern 20, may be formed. In some example embodiments, edge portions of the fourth and third sub-spacers 15 and 17 may be exposed.

Figure 9A:
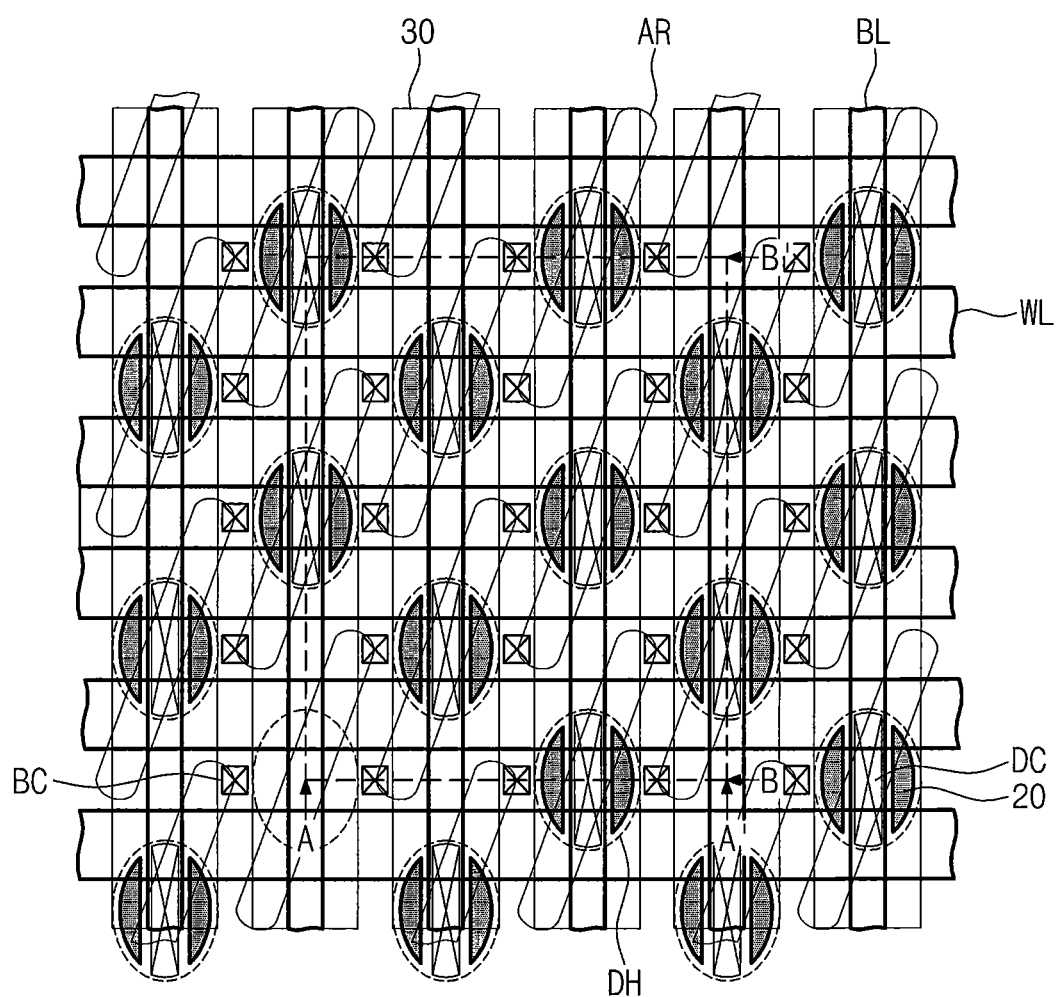
Figure 9B:
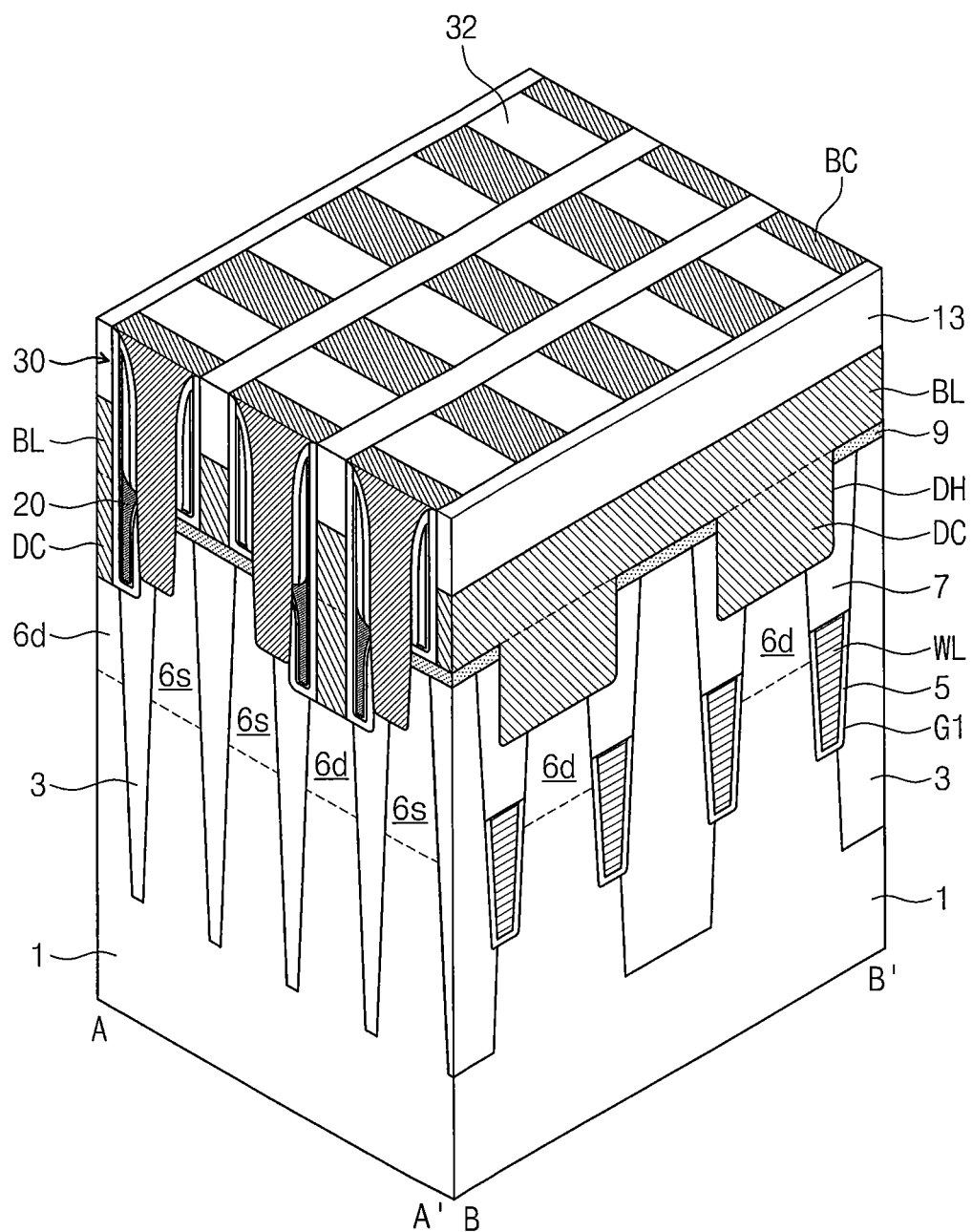

Referring to FIGS. 9A and 9B, a second insulating layer 32 may be formed to fill a space between the bit lines BL in the direction D2. Storage node contact plugs BC may be formed through the second insulating layer 32 and the first insulating layer 9 to be connected to the first doped regions 6s, respectively.

This process will be described in still greater detail with reference to, for example, FIGS. 10K and 10L.

Figure 10K:
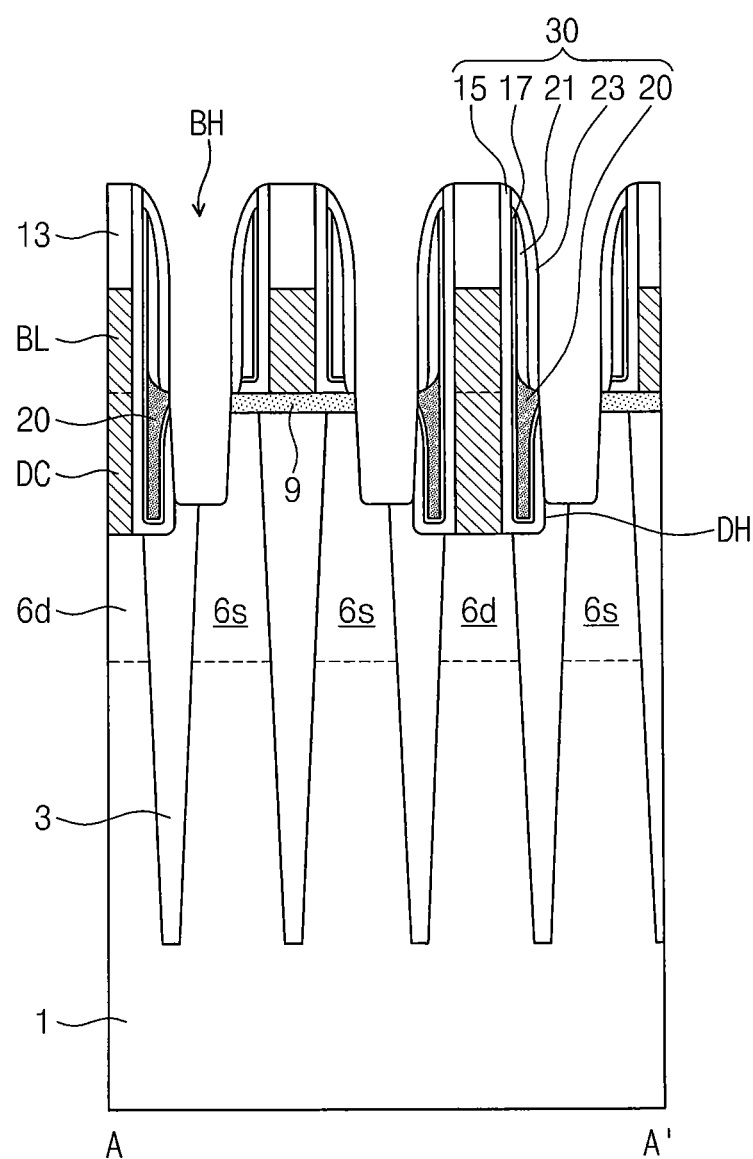

Referring to FIGS. 9A, 9B and 10K, the second insulating layer 32 may be formed to fill spaces between the bit lines BL, and an etching process may be performed to remove portions of the second insulating layer 32, the first insulating layer 9, the substrate 1, and the device isolation layer 3 on regions where the storage node contact plugs BC is to be formed, thereby forming storage node contact holes BH. In some example embodiments, the edge portions of the fourth and third sub-spacers 15 and 17 and the etch stop patterns 20 adjacent to the storage node contact holes BH may be etched or removed. The storage node contact holes BH may be formed to have bottom surfaces that are higher than bottom surfaces of the first doped regions 6s. The storage node contact holes BH may be formed to expose side surfaces of the etch stop patterns 20 and the first sub-spacers 23, but not to expose the second sub-spacer 21.

A natural oxide layer formed in the storage node contact holes BH may be removed by a cleaning process using a fluorine-containing etchant, between the formation of the storage node contact holes BR and the formation of the storage node contact plugs BC. Since the first sub-spacer 23 and the etch stop pattern 20 may be formed of materials having an etch selectivity with respect to the natural oxide layer, they may not be etched. Further, since the etch stop patterns 20 may be formed to cover edge portions the second sub-spacers 21 in the storage node contact hole BR, it is possible to prevent the second sub-spacer 21 from being removed or damaged in the cleaning process used to remove the natural oxide layer, although the second sub-spacers 21 are formed of silicon oxide.

Figure 10L:
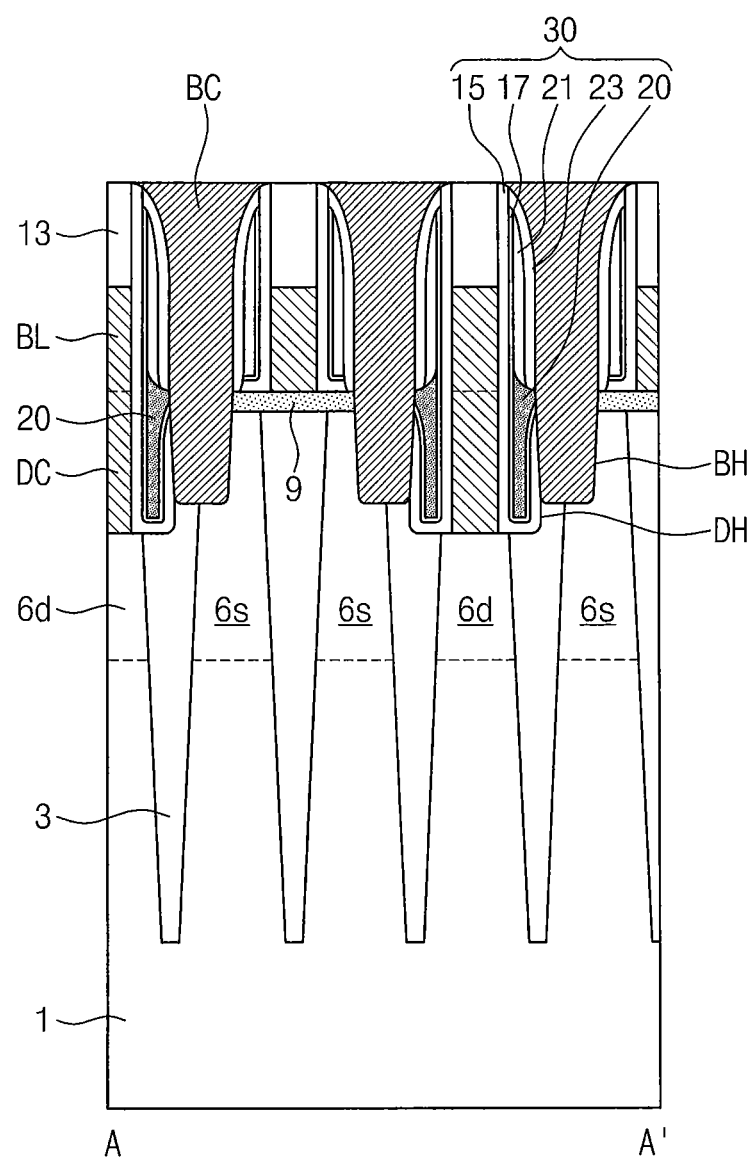

Referring to FIG. 10L, a conductive layer may be formed to fill the storage node contact holes BH, and then, a planarization etching process may be performed to form storage node contact plugs BC. Since it is possible to prevent the second sub-spacer 21 from being damaged in the cleaning process for removing the natural oxide layer, the bitline node contact plugs DC may expand into the spacer 30. In other words, the spacer 30 may separate the bitline node contact plug DC from the storage node contact plug BC by a designed space, and thus, it is possible to prevent or reduce a leakage current between the bitline node contact plugs DC and the storage node contact plugs BC from occurring.

Referring back to FIGS. 1A and 1B, lower electrodes BE may be formed to be in contact with the storage node contact plugs BC, respectively. A dielectric layer and an upper electrode may be formed on the lower electrodes BE.

In the case where the spacer 30 has the air-gap region AG as shown in FIG. 3B, the spacer 30 may be formed by the following process. As shown in FIG. 10G, the second sub-spacer layer 21 may be formed of a material having an etch selectivity with respect to the fourth, third, and first spacers 15, 17, and 23 and the etch stop pattern 20. As shown in FIG. 10J, after the formation of the spacer 30, a predetermined upper portion of the spacer 30 may be removed to form an opening exposing an upper portion of the second sub-spacer 21. Thereafter, the second sub-spacer 21 may be selectively removed through the opening. For example, the second sub-spacer layer 21 may be formed of a hydrocarbon layer. In this case, after the formation of the opening, an ashing process may be performed to remove the second sub-spacer layer 21. During the ashing process, oxygen-containing gas may be supplied through the opening, and then, be reacted with the hydrocarbon layer. As the result of the reaction between the oxygen-containing gas and the second sub-spacer 21, the second sub-spacer 21 may be converted into carbon dioxide gas, carbon monoxide gas, and/or methane gas, which can be easily exhausted to the outside through the opening. Accordingly, the air-gap region AG can be formed.

Figure 11:
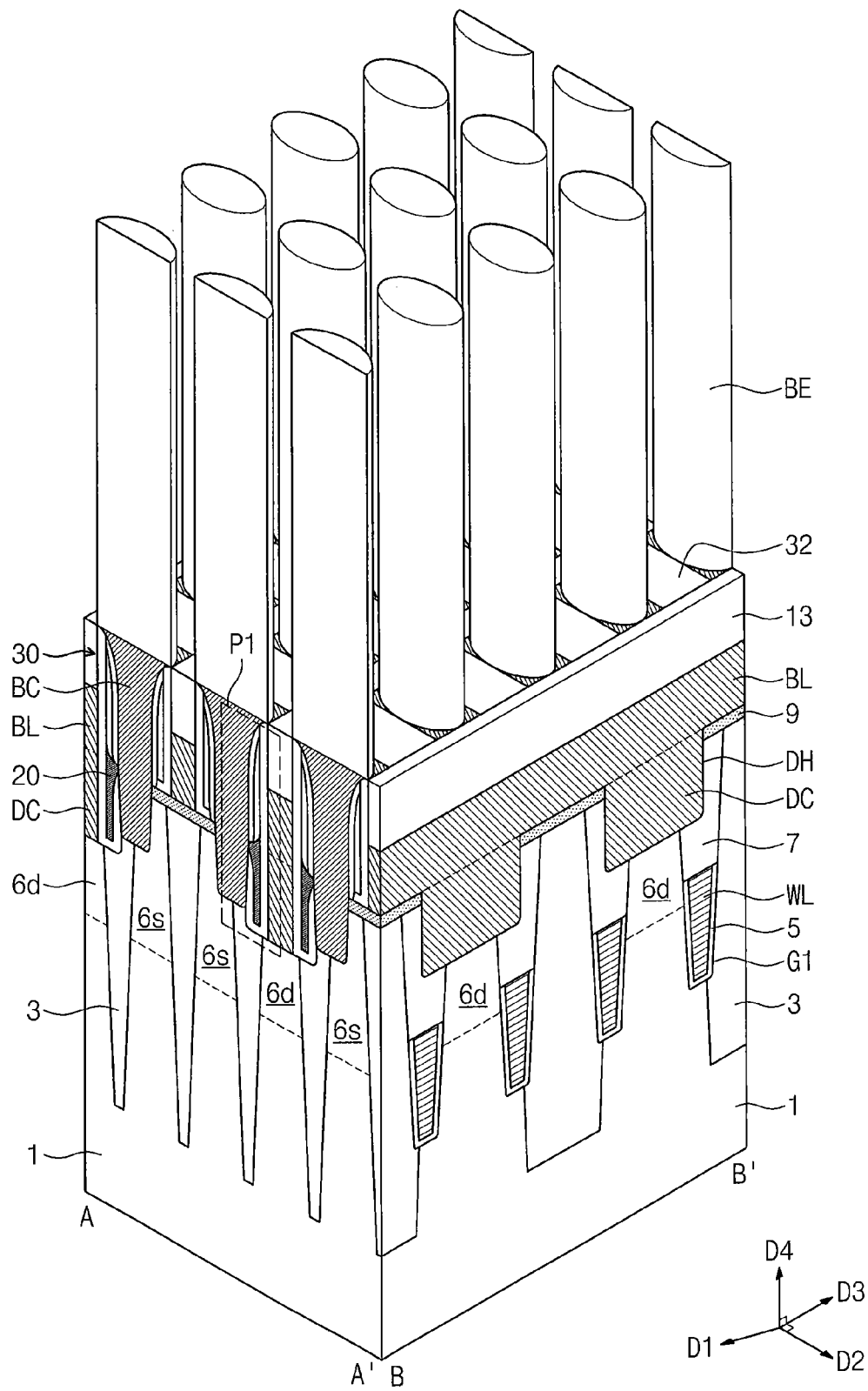
FIG. 11 is a perspective view illustrating a portion of FIG. 1A, according to some example embodiments of the inventive concept.
Figure 12A:
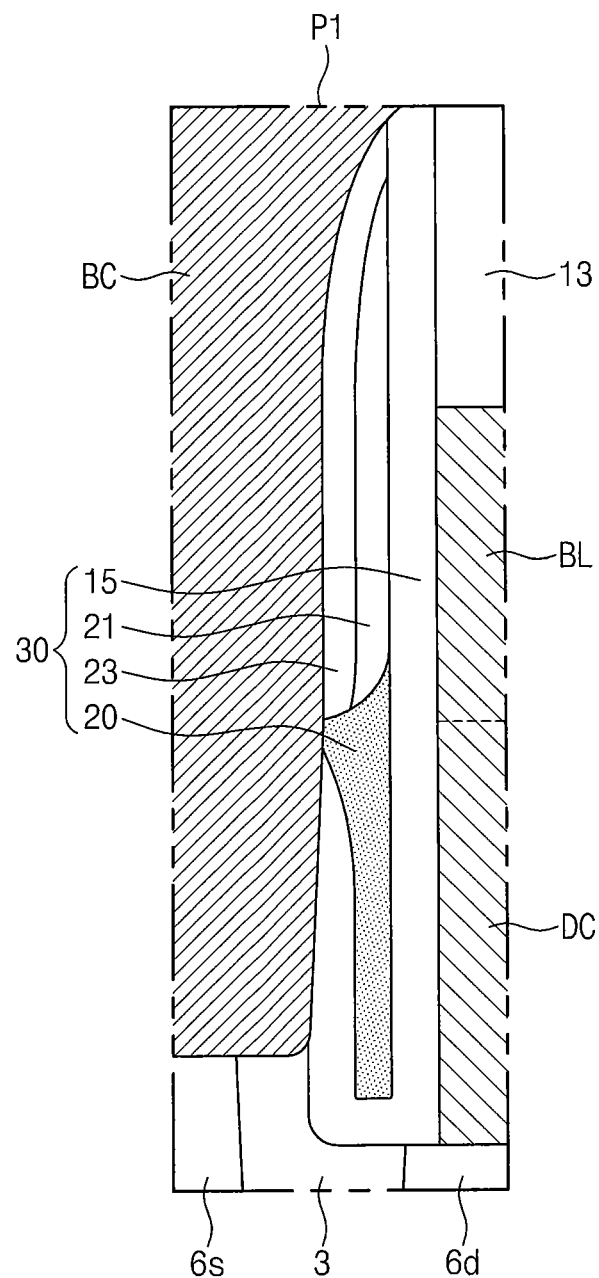
FIGS. 12A and 12B are enlarged cross-sectional views exemplarily illustrating a portion 'P1' of FIG. 11.
Figure 12B:
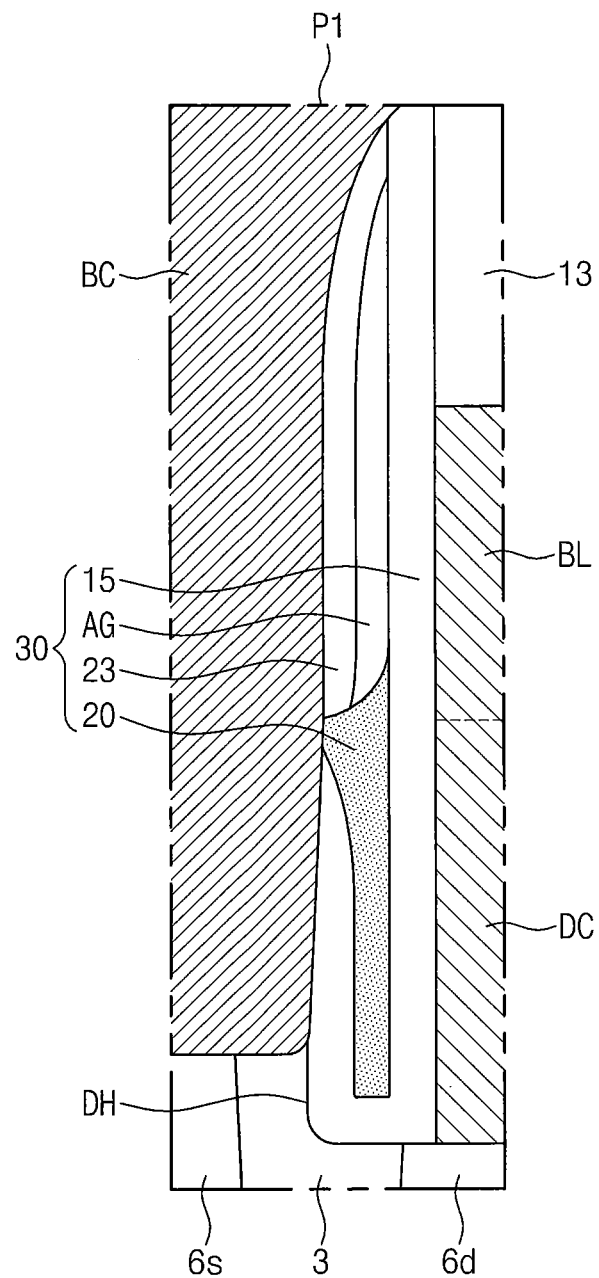

FIG. 11 is a perspective view illustrating a portion of FIG. 1A, according to other example embodiments of the inventive concept. FIGS. 12A and 12B are enlarged cross-sectional views exemplarily illustrating a portion 'P1' of FIG. 11.

Referring to FIGS. 11 and 12A, in the present embodiment, the spacer 30 may include the first sub-spacer 23, the second sub-spacer 21, the fourth sub-spacer 15, and the etch stop pattern 20, but not the third sub-spacer 17. Alternatively, as shown in FIG. 12B, the spacer 30 may include the air-gap region AG instead of the second sub-spacer 21. The etch stop pattern 20 may be in direct contact with the fourth sub-spacer 15, instead of the third sub-spacer 17. Otherwise, the semiconductor device in such embodiments may be configured to have substantially the same features as described herein.

Figure 13A:
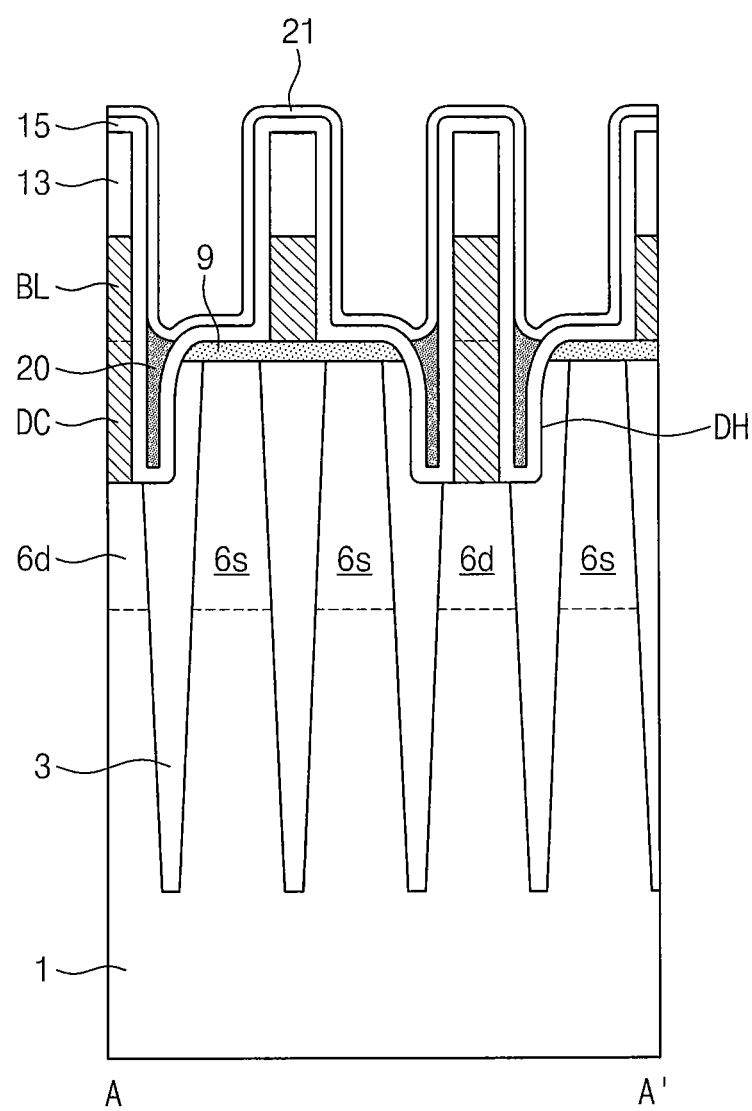
FIGS. 13A and 13B are cross-sectional views illustrating methods of forming the semiconductor device having a sectional view taken along a section B-B' of FIG. 11.
Figure 13B:
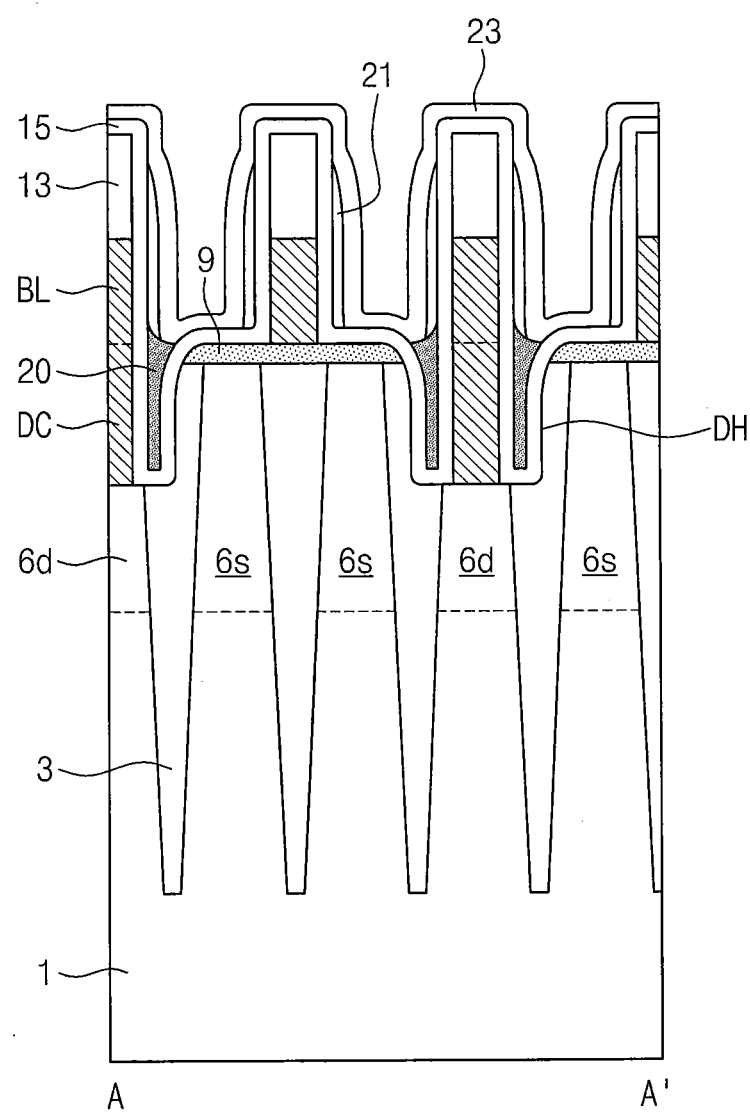

FIGS. 13A and 13B are cross-sectional views illustrating methods of forming the semiconductor device having a cross-sectional view taken along a section B-B' of FIG. 11.

Referring to FIG. 13A, after the formation of the fourth sub-spacer layer 15 as shown in FIG. 10C, the etch stop layer may be formed and etched isotropically to form the etch stop patterns 20, but the formation of the third sub-spacer layer 17 of the previous embodiment may be omitted. Thereafter, the second sub-spacer layer 21 may be conformally formed on the substrate 1. The second sub-spacer layer 21 may be formed of a material having an etch selectivity with respect to both of the fourth sub-spacer layer 15 and the etch stop pattern 20.

Referring to FIG. 13B, an anisotropic etching process may be performed to the second sub-spacer layer 21 to form the second sub-spacers 21. The first sub-spacer layer 23 may be conformally formed on the resulting structure with the second sub-spacers 21. For example, the second sub-spacer layer 21 may be formed of a silicon oxide layer, while the first and fourth sub-spacers 23 and 15 and the etch stop patterns 20 may be formed of a silicon nitride layer.

Referring to FIGS. 11 and 12A, an anisotropic etching process may be performed to the first sub-spacer layer 23 to form the first sub-spacers 23. A subsequent process may be performed in the same or similar manner as that of the previous embodiment.

Alternatively, the first sub-spacer 23 may be selectively removed to form the air-gap regions AG shown in FIG. 12B.

Figure 14:
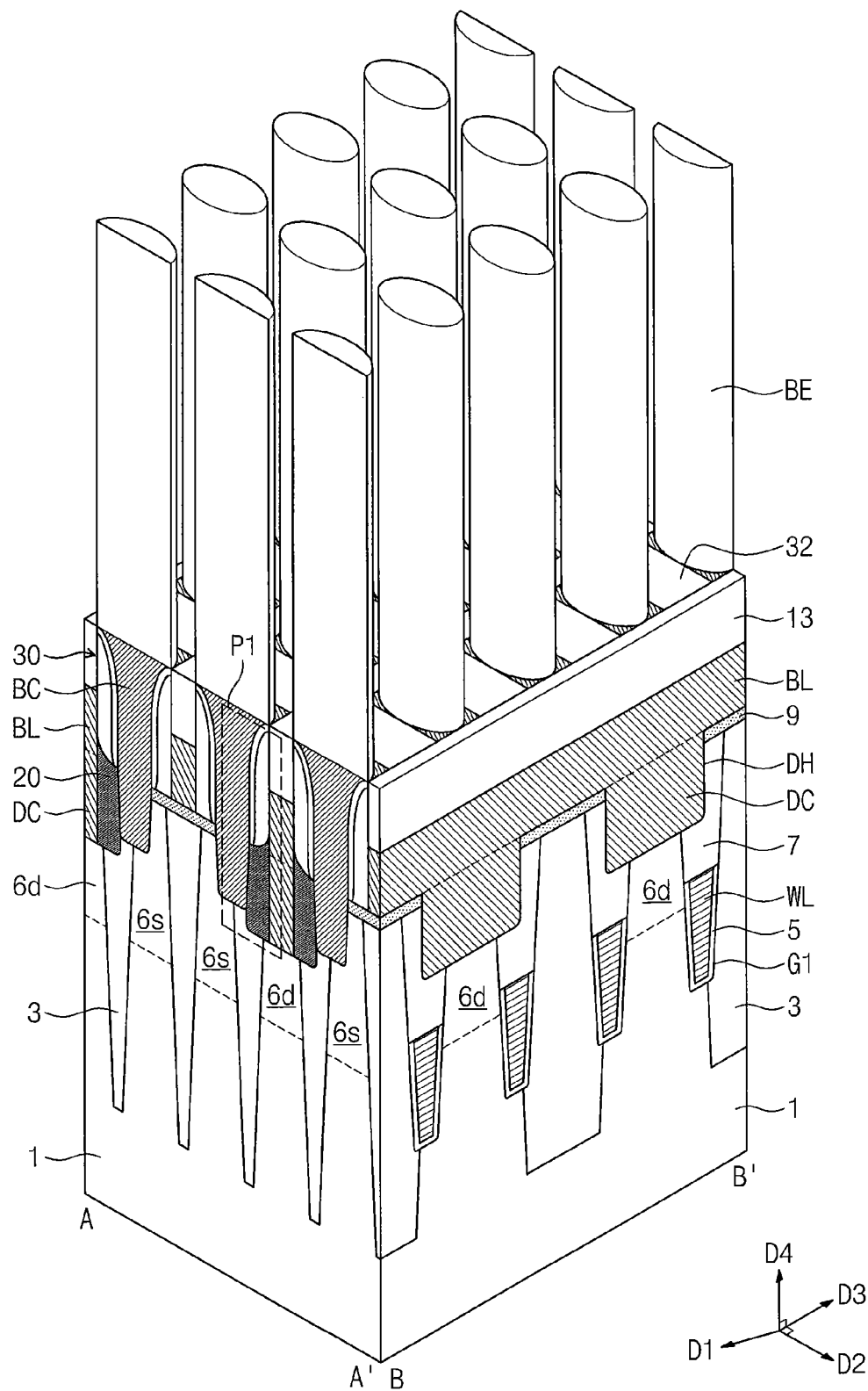
FIG. 14 is a perspective view illustrating a portion of FIG. 1A, according to some other example embodiments of the inventive concept.
Figure 15A:
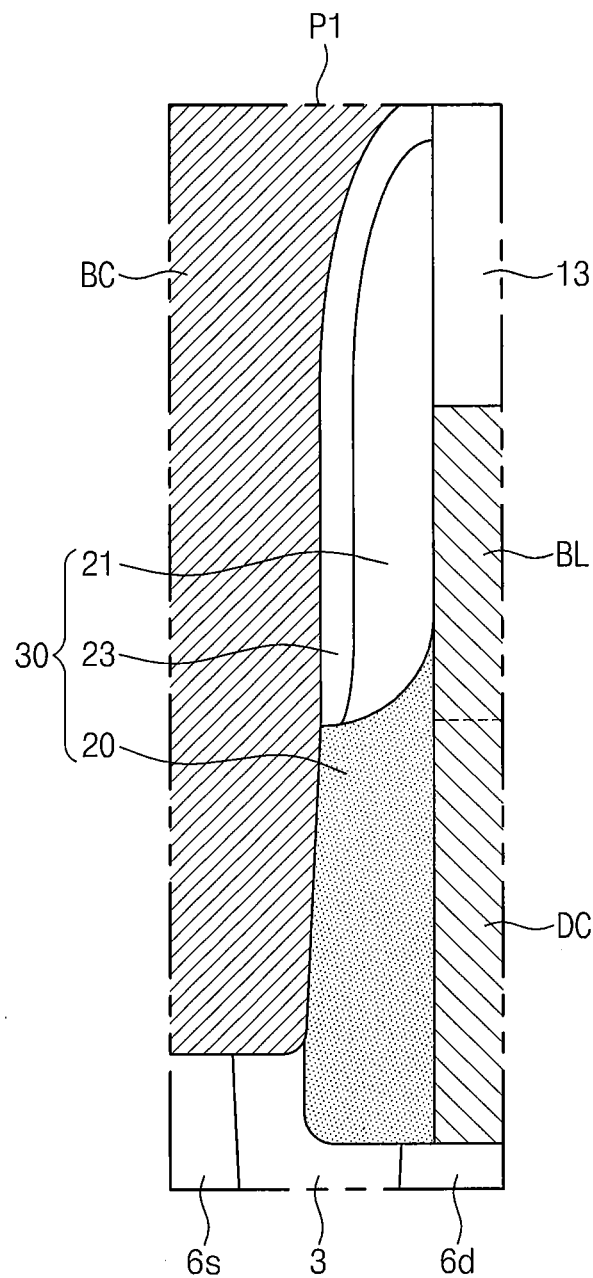
FIGS. 15A and 15B are enlarged cross-sectional views exemplarily illustrating a portion 'P1' of FIG. 14.
Figure 15B:
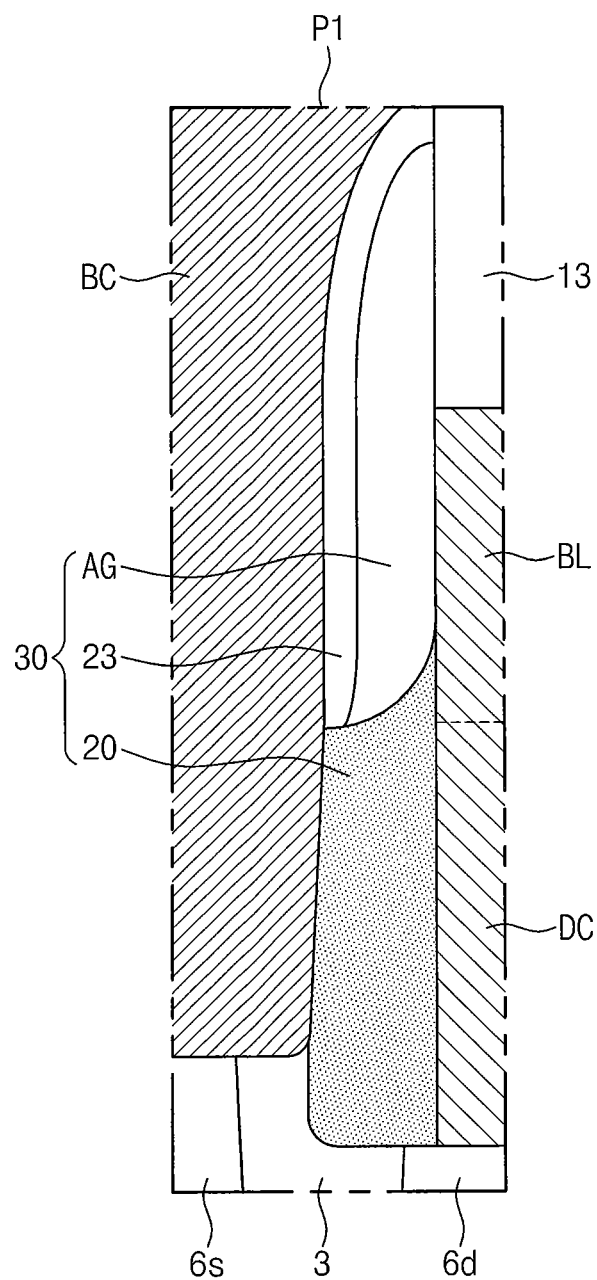

FIG. 14 is a perspective view illustrating a portion of FIG. 1A, according to still other example embodiments of the inventive concept. FIGS. 15A and 15B are enlarged sectional views exemplarily illustrating a portion 'P1' of FIG. 14.

Referring to FIGS. 14 and 15A, in the present embodiment 3, the spacer 30 may include the first sub-spacer 23, the second sub-spacer 21, and the etch stop pattern 20, but not the third sub-spacer 17 and the fourth sub-spacer 15 of the previous embodiment. Alternatively, as shown in FIG. 15B, the spacer 30 may include the air-gap regions AG instead of the second sub-spacers 21. The etch stop pattern 20 may be provided to fill a space between the bitline node contact plug DC and the storage node contact plug BC and be in contact with both of the bitline node contact plug DC and the storage node contact plug BC. Otherwise, the semiconductor device in the present embodiment may be configured to have substantially the same features as described herein.

Figure 16A:
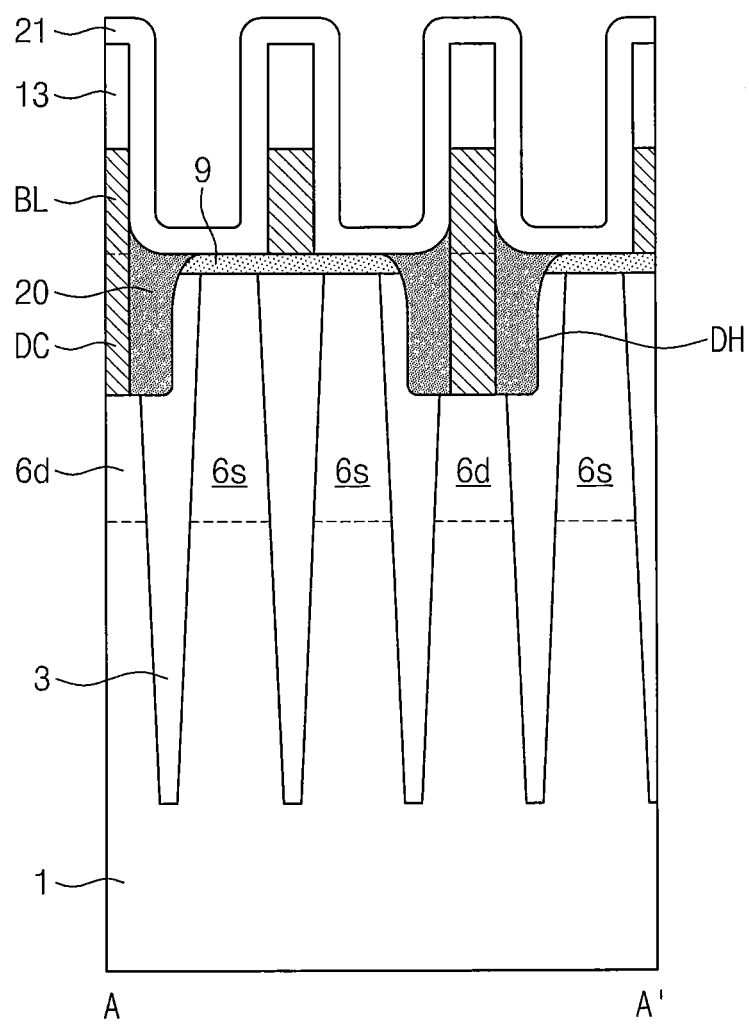
FIGS. 16A and 16B are cross-sectional views illustrating methods of forming the semiconductor device having a sectional view taken along a section B-B' of FIG. 14.
Figure 16B:
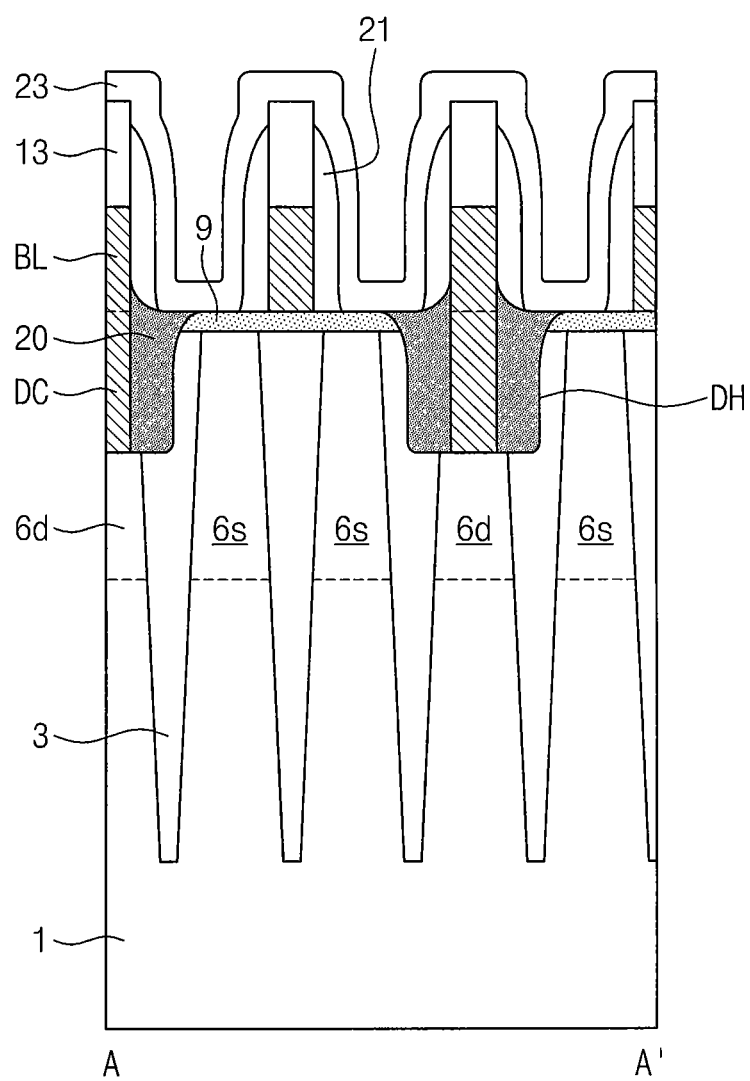

FIGS. 16A and 16B are sectional views illustrating a process of fabricating the semiconductor device having a sectional view taken along a section B-B' of FIG. 14.

Referring to FIG. 16A, after the formation of the bit line BL and the bitline node contact plug DC as shown in FIG. 10B, the etch stop layer may be formed to fill the bitline node contact hole DH, and then be isotropically etched to form the etch stop pattern 20, but the formation of the fourth and third sub-spacer layers 15 and 17 of the previous embodiment may be omitted. The second sub-spacer layer 21 may be conformally formed on the resulting structure.

Referring to FIG. 16B, an anisotropic etching process may be performed to the second sub-spacer layer 21 to form the second sub-spacer 21. Next, the first sub-spacer layer 23 may be conformally formed on the resulting structure.

Referring to FIGS. 14 and 15A, an anisotropic etching process may be performed to the first sub-spacer layer 23 to form the first sub-spacer 23. In the present embodiment, the second sub-spacer 21 may be formed of, for example, a silicon oxide layer, while the first sub-spacer 23 and the etch stop pattern 20 may be formed of a silicon nitride layer. A subsequent process may be performed in the same or similar manner as that of the previous embodiment.

Alternatively, the first sub-spacer 23 may be selectively removed to form the air-gap regions AG shown in FIG. 15B.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and a wafer-level processed stack package (WSP) technique.

The package in which the semiconductor memory device according to some embodiments is mounted may further include at least one semiconductor device (e.g., a controller and/or a logic device) configured to control the semiconductor memory device.

Figure 17:
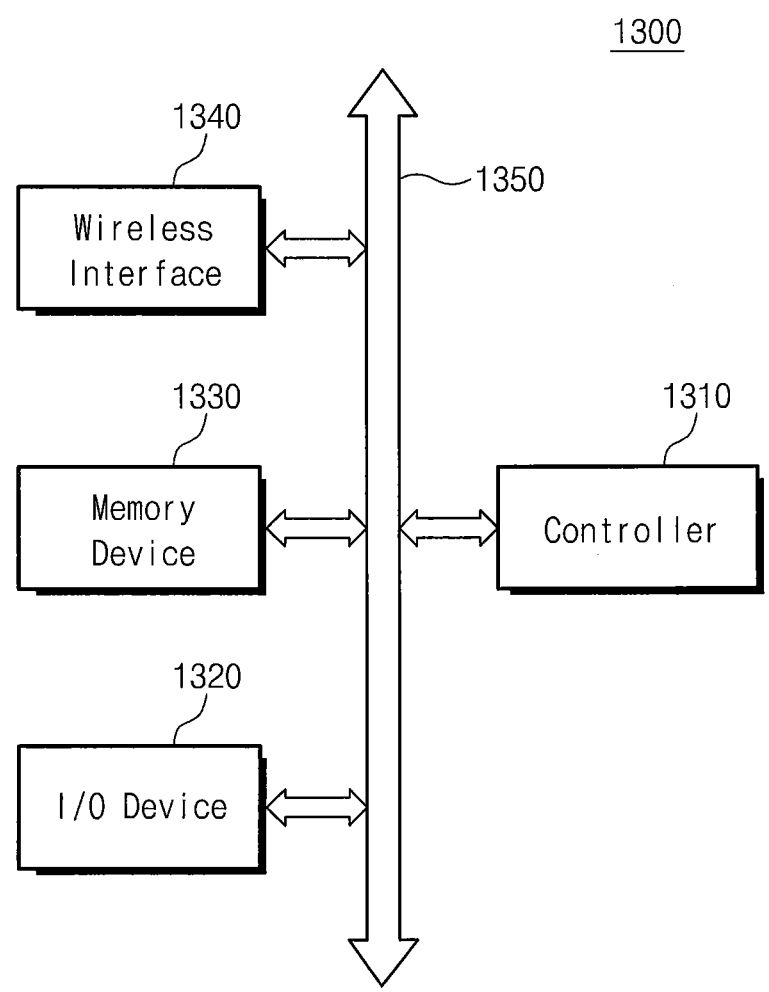
FIG. 17 is a block diagram schematically illustrating electronic devices including a semiconductor device according to example embodiments of the inventive concepts.

FIG. 17 is a block diagram schematically illustrating electronic devices including a semiconductor device according to example embodiments of the inventive concepts.

Referring to FIG. 17, an electronic device 1300 including a semiconductor device according to example embodiments of the inventive concepts may be used in one of a personal digital assistant (PDA), a laptop computer, a mobile computer, a web tablet, a wireless phone, a cell phone, a digital music player, a wired or wireless electronic device, or a complex electronic device including at least two ones thereof. The electronic device 1300 may include a controller 1310, an input/output device 1320 such as a keypad, a keyboard, a display, a memory device 1330, and a wireless interface 1340 that can communicate through a bus 1350. The controller 1310 may include, for example, at least one microprocessor, a digital signal process, a microcontroller or the like. The memory device 1330 may be configured to store a command code to be used by the controller 1310 or a user data. The memory device 1330 may include a semiconductor device including a vertical channel transistor according to example embodiments of the inventive concepts. The electronic device 1300 may use the wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 18:
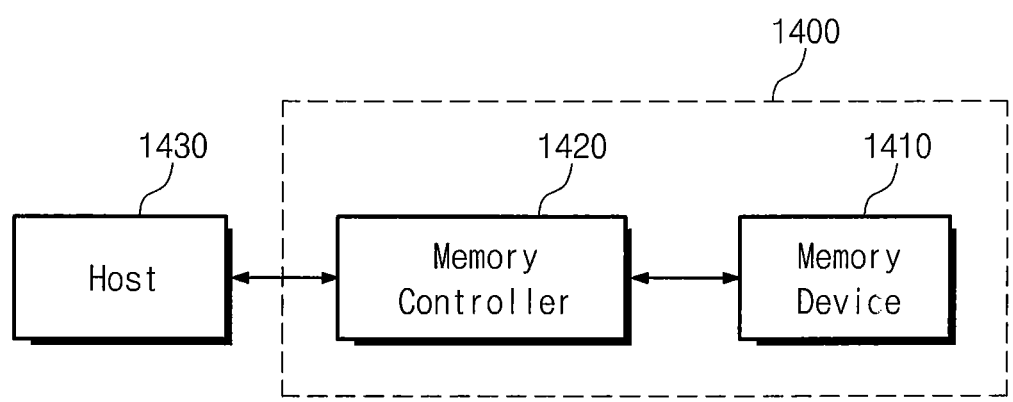
FIG. 18 is a block diagram schematically illustrating memory systems including a semiconductor device according to example embodiments of the inventive concepts.

FIG. 18 is a block diagram schematically illustrating memory systems including a semiconductor device according to example embodiments of the inventive concepts.

Referring to FIG. 18, a memory system including a semiconductor device according to example embodiments of the inventive concepts will be described. The memory system 1400 may include a memory device 1410 for storing and a memory controller 1420. The memory controller 1420 can control the memory device 1410 to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device including a vertical channel transistor according to example embodiments of the inventive concept.

According to example embodiments of the inventive concept, the etch stop pattern and the second sub-spacer of the spacer may be exposed when the bitline node contact hole is formed. However, the etch stop pattern and the second sub-spacer may be formed of materials having an etch selectivity with respect to a natural oxide layer, and thus, they may not be etched in a process of removing the natural oxide layer, thereby serving as an etch stopper. As a result, the space may not be etched by the process of etching the natural oxide layer. This may prevent the storage node contact plug (formed in a subsequent process) from expanding into the spacer. Accordingly, it is possible to reduce leakage current between the bitline node contact plug and the storage node contact plug.

In addition, according to other example embodiments of the inventive concept, the semiconductor device may be configured to include the air-gap region provided in the spacer, and thus, it is possible to improve electrical characteristics (such as electrical isolation, electrical interference, or leakage current) between the storage node contact plug and the bit line.

While example embodiments of the inventive concepts have been particularly shown and described, it will be understood by one of ordinary skill in the art that variations in form and detail may be made therein without departing from the spirit and scope of the attached claims.

What is claimed:

1. A method of forming a semiconductor device comprising:
   removing a portion of a substrate to form a bitline node contact hole;
   forming a bitline contact in the bitline node contact hole;
   forming an etch stop pattern and a separate spacer on a sidewall of the bitline contact, wherein the etch stop pattern and the separate spacer each comprise material having an etch selectivity relative to an oxide;
   forming a storage node contact plug hole so that the etch stop pattern and the separate spacer form a portion of a sidewall of the storage node contact plug hole spaced apart from the bitline contact; and
   cleaning the storage node contact plug hole to remove a natural oxide formed in the storage node contact plug hole.

2. The method of claim 1 wherein the etch stop pattern includes an uppermost a curved surface in contact with a lowest most portion of the separate spacer.

3. The method of claim 1 wherein the spacer further comprises a gap region.

4. The method of claim 3 wherein the gap region comprises an air-gap region between a sidewall thereof and the bitline above the etch stop pattern.

5. The method of claim 3 wherein the air-gap region exposes a sidewall of the bitline.

6. The method of claim 5 wherein a total width of the spacer is substantially equal to a maximum width of the etch stop pattern.

7. The method of claim 1 wherein the etch stop pattern and the separate spacer comprise identical materials.

8. The method of claim 1 wherein forming an etch stop pattern is preceded by:
   forming spaced-apart first and second doped regions in the substrate;
   forming an insulating layer on the substrate to define an opening exposing the second doped region; and
   removing the portion of the substrate exposed by the opening to form the bitline node contact hole.

9. The method of claim 1 wherein forming an etch stop pattern and a separate spacer on a sidewall of a bitline contact further comprises:
   forming a second spacer between the separate spacer and the sidewall of the bitline contact, in contact with the bitline node contact plug and the etch stop pattern.

10. The method of claim 9 further comprising:
    forming a storage node contact plug in the storage node contact plug hole.

11. A method of fabricating a semiconductor device, comprising:
    forming spaced-apart first and second doped regions in a substrate;
    forming an insulating layer on the substrate to define an opening exposing the second doped region;
    removing a portion of the substrate exposed by the opening to form a bitline node contact hole, the bitline node contact hole formed to have a bottom surface lower than a top surface of the substrate;
    forming a bit line and a bitline node contact plug that are provided on the insulating layer and in the bitline node contact hole, respectively;
    forming a spacer in the bitline node contact hole; and
    forming a storage node contact plug electronically connected to the first doped region,
    wherein the bit line and the bitline node contact plug are spaced apart from the storage node contact plug with the spacer interposed therebetween, and
    wherein at least a portion of the spacer is formed of a material having an etch selectivity with respect to a natural oxide layer.

12. The method of claim 11, wherein forming the spacer comprises:
    forming a etch stop pattern to fill at least a portion of the bitline node contact hole;
    forming a first sub-spacer to cover a sidewall of the bit line; and
    forming a second sub-spacer to cover a sidewall of the first sub-spacer and in contact with a top surface of the etch stop pattern.

13. The method of claim 11, wherein forming the storage node contact plug comprises:
    removing at least a portion of the insulating layer adjacent to the spacer to form a storage node contact hole exposing the first doped region;
    removing a natural oxide layer from the storage node contact hole; and
    forming a storage node contact plug to fill the storage node contact hole.

14. The method of claim 11, further comprising:
    forming, a device isolation layer in the substrate to define an active region that includes the first and second doped regions,
    wherein the bitline node contact hole extends to a portion of the device isolation layer adjacent to the second doped region.

15. A method of fabricating a semiconductor device, comprising:
    forming a first doped region and a second doped region in a substrate, the first and second doped regions being spaced apart from each other;
    forming an insulating layer on the substrate to define an opening exposing the second doped region;
    removing a portion of the substrate exposed by the opening to form a bitline node contact hole;

forming a bit line and a bitline node contact plug that are provided on the insulating layer and in the bitline node contact hole, respectively;

forming a spacer to cover sidewalls of the bit line and the bitline node contact plug; and forming a storage node contact plug to be in contact with the spacer and the first doped region, wherein forming spacer comprises:

forming a first sub-spacer to cover the sidewall of the bit line;

forming the etch stop pattern to fill the bitline node contact hole.

16. The method of claim 15, wherein the forming of the spacer further comprises:

forming a second sub-spacer to cover a sidewall of the first sub-spacer and be in contact with a top surface of the etch stop pattern.

17. The method of claim 15, further comprising selectively removing the first sub-spacer to form an air-gap region.

18. The method of claim 16, wherein the forming of the storage node contact plug comprises:

removing at least a portion of the insulating layer adjacent to the spacer to form a storage node contact hole exposing the first doped region; and forming a storage node contact plug to fill the storage node contact hole, wherein the storage node contact hole is formed to expose side surfaces of the etch stop pattern and the second sub-spacer but not to expose the first sub-spacer.

19. The method of claim 18, further comprising removing a natural oxide layer from the storage node contact hole, wherein each of the second sub-spacer and the etch stop pattern is formed of a material having an etch selectivity with respect to the natural oxide layer.

* * * * *